(12) United States Patent
Yang et al.

(10) Patent No.: US 11,088,020 B2
(45) Date of Patent: Aug. 10, 2021

(54) STRUCTURE AND FORMATION METHOD OF INTERCONNECTION STRUCTURE OF SEMICONDUCTOR DEVICE

(71) Applicant: Taiwan Semiconductor Manufacturing Co., Ltd., Hsinchu (TW)

(72) Inventors: Tai-I Yang, Hsinchu (TW); Wei-Chen Chu, Taichung (TW); Li-Lin Su, Taichung (TW); Shin-Yi Yang, New Taipei (TW); Cheng-Chi Chuang, New Taipei (TW); Hsin-Ping Chen, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/691,035

(22) Filed: Aug. 30, 2017

(65) Prior Publication Data
US 2019/0067089 A1 Feb. 28, 2019

(51) Int. Cl.
*H01L 21/768* (2006.01)
*H01L 23/522* (2006.01)
*H01L 23/532* (2006.01)

(52) U.S. Cl.
CPC .... *H01L 21/76829* (2013.01); *H01L 21/7684* (2013.01); *H01L 21/7685* (2013.01); *H01L 21/76802* (2013.01); *H01L 21/76811* (2013.01); *H01L 21/76831* (2013.01); *H01L 21/76843* (2013.01); *H01L 21/76846* (2013.01); *H01L 21/76865* (2013.01); *H01L 21/76877* (2013.01); *H01L 23/5226* (2013.01); *H01L 23/53209* (2013.01); *H01L 23/53238* (2013.01); *H01L 23/53252* (2013.01)

(58) Field of Classification Search
None
See application file for complete search history.

(56) References Cited

U.S. PATENT DOCUMENTS 6,100,118 A * 8/2000 Shih ............... H01L 23/5258
257/E23.15
7,285,474 B2 * 10/2007 Anderson ......... H01L 21/76802
257/E21.579

(Continued)

*Primary Examiner* — Telly D Green
(74) *Attorney, Agent, or Firm* — Birch, Stewart, Kolasch & Birch, LLP

(57) ABSTRACT

Structures and formation methods of a semiconductor device structure are provided. The semiconductor device structure includes a conductive feature in a first dielectric layer. The semiconductor device structure also includes an etching stop layer over the first dielectric layer and a second dielectric layer over the etching stop layer. The semiconductor device structure further includes a conductive via in the etching stop layer and the second dielectric layer. In addition, the semiconductor device structure includes a conductive line over the conductive via. The semiconductor device structure also includes a first barrier liner covering the bottom surface of the conductive line. The semiconductor device structure further includes a second barrier liner surrounding sidewalls of the conductive line and the conductive via. The conductive line and the conductive via are confined in the first barrier liner and the second barrier liner.

20 Claims, 13 Drawing Sheets

(56) References Cited

U.S. PATENT DOCUMENTS

| | | | |
|---|---|---|---|
| 9,082,719 B2* | 7/2015 | Brencher | H01L 21/31116 |
| 9,818,644 B2* | 11/2017 | Yang | H01L 23/53276 |
| 9,991,200 B2* | 6/2018 | Ting | H01L 23/5226 |
| 2002/0098673 A1* | 7/2002 | Yeh | H01L 21/76807 |
| | | | 438/618 |
| 2003/0160331 A1* | 8/2003 | Fujisawa | H01L 21/76805 |
| 2004/0251549 A1* | 12/2004 | Huang | H01L 21/76804 |
| | | | 257/758 |
| 2006/0194430 A1* | 8/2006 | Beck | H01L 21/76805 |
| | | | 438/627 |
| 2009/0093100 A1* | 4/2009 | Xia | C23C 16/325 |
| | | | 438/421 |
| 2009/0243036 A1* | 10/2009 | Kim | H01L 28/40 |
| | | | 257/532 |
| 2010/0127233 A1* | 5/2010 | Goux | H01L 45/04 |
| | | | 257/3 |
| 2015/0123279 A1* | 5/2015 | Chi | H01L 21/76846 |
| | | | 257/751 |
| 2016/0093566 A1* | 3/2016 | Ting | H01L 23/5226 |
| | | | 257/774 |
| 2016/0218035 A1* | 7/2016 | Yang | H01L 23/53276 |
| 2018/0174961 A1* | 6/2018 | Ting | H01L 23/5226 |
| 2019/0067087 A1* | 2/2019 | Briggs | H01L 21/76811 |

* cited by examiner

STRUCTURE AND FORMATION METHOD OF INTERCONNECTION STRUCTURE OF SEMICONDUCTOR DEVICE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
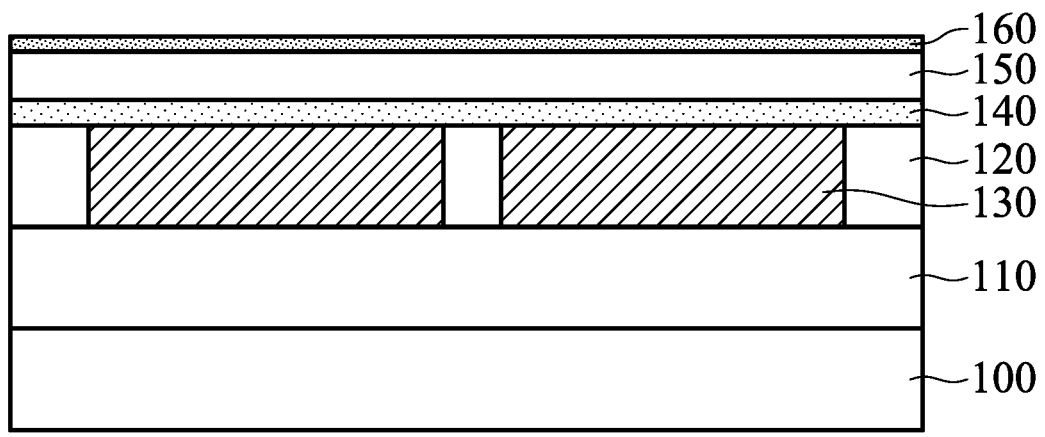
FIGS. 1A-1L are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1L are cross-sectional views of various stages of a process for forming a semiconductor device structure, in accordance with some embodiments. As shown in FIG. 1A, a semiconductor substrate 100 is provided. In some embodiments, the semiconductor substrate 100 is a bulk semiconductor substrate, such as a semiconductor wafer. The semiconductor substrate 100 may include silicon or another elementary semiconductor material such as germanium. For example, the semiconductor substrate 100 is a silicon wafer. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the semiconductor substrate 100. The device elements are not shown in figures for the purpose of simplicity and clarity. Examples of the various device elements include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the semiconductor substrate 100. The isolation features are used to define active regions and electrically isolate various device elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

In some embodiments, an interconnection structure (which will be described in more detail later) is formed over the semiconductor substrate 100. The interconnection structure includes multiple dielectric layers containing an interlayer dielectric (ILD) layer and one or more inter-metal dielectric (IMD) layers. The interconnection structure also includes multiple conductive features formed in the ILD and IMD layers. The conductive features may include conductive lines, conductive vias, and/or conductive contacts. Various processes, such as back-end-of-line (BEOL) semiconductor fabrication processes, are performed to form the interconnection structure.

Various device elements are interconnected through the interconnection structure over the semiconductor substrate 100 to form integrated circuit devices. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

More specifically, as shown in FIG. 1A, a dielectric layer 110 is deposited over the semiconductor substrate 100. The dielectric layer 110 may serve as an ILD or IMD layer of an interconnection structure. The dielectric layer 110 covers device elements formed in and/or over the semiconductor substrate 100. Although FIG. 1A shows that the dielectric layer 110 is a single layer, embodiments of the disclosure are not limited thereto. In some other embodiments, the dielectric layer 110 is a multi-layer structure including dielectric sub-layers (not shown).

In some embodiments, the dielectric layer 110 is made of or includes a low dielectric constant (low-k) material, an extreme low-k (ELK) material, silicon oxide, silicon oxynitride, borosilicate glass (BSG), phosphoric silicate glass (PSG), borophosphosilicate glass (BPSG), fluorinated silicate glass (FSG), one or more other suitable materials, or a combination thereof. In some embodiments, the dielectric layer 110 is deposited using a chemical vapor deposition (CVD) process, an atomic layer deposition (ALD) process, a spin-on process, a spray coating process, one or more other applicable processes, or a combination thereof.

The low-k or ELK material may have a smaller dielectric constant than that of silicon dioxide. For example, the low-k material may have a dielectric constant in a range from about 1.5 to about 3.5. The ELK material may have a dielectric constant, which is less than about 2.5 or in a range from about 1.5 to about 2.5. As the density of semiconductor devices increases and the size of circuit elements becomes smaller, the resistance capacitance (RC) delay time increasingly dominates circuit performance. Therefore, using a low-k or ELK material as the dielectric layer 110 is helpful for reducing the RC delay.

A wide variety of low-k or ELK material may be used for forming the dielectric layer 110. In some embodiments, the dielectric layer 110 is made of or includes a porous dielectric material, an organic polymer, an organic silica glass, SiOF series material, a hydrogen silsesquioxane (HSQ) series material, a methyl silsesquioxane (MSQ) series material, carbon doped silicon oxide, amorphous fluorinated carbon, parylene, benzocyclobutenes (BCB), polytetrafluoroethylene (PTFE) (Teflon), silicon oxycarbide polymers (SiOC), a porous organic series material, a spin-on inorganic dielectric, a spin-on organic dielectric, one or more other suitable materials, or a combination thereof.

Multiple conductive features (not shown) are formed in the dielectric layer 110. The conductive features are electrically connected to the device elements. In some embodiments, the conductive features are made of or include copper (Cu), aluminum (Al), tungsten (W), titanium (Ti), cobalt (Co), nickel (Ni), gold (Au), platinum (Pt), one or more other suitable materials, or a combination thereof. Various processes, including deposition, etching, planarization, or the like, may be used to form the conductive features in the dielectric layer 110.

As shown in FIG. 1A, a dielectric layer 120 is deposited over the dielectric layer 110. The dielectric layer 120 may serve as an IMD layer of an interconnection structure. Although FIG. 1A shows that the dielectric layer 120 is a single layer, embodiments of the disclosure are not limited thereto. In some other embodiments, the dielectric layer 120 is a multi-layer structure including dielectric sub-layers (not shown). The materials and/or formation methods of the dielectric layer 120 are the same as or similar to those of the dielectric layer 110, as illustrated in the aforementioned embodiments, and therefore are not repeated.

Multiple conductive features are formed in the dielectric layer 120. Conductive features 130 are shown in FIG. 1A as an example. It should be noted that the dimensions of the conductive features 130 shown in FIG. 1A are only an example and not a limitation to the disclosure. The conductive features 130 may be conductive lines or other suitable conductive features. The conductive features 130 may be single or dual damascene structures. The conductive features 130 are electrically connected to the device elements through the conductive features (not shown) in the dielectric layer 110.

Although FIG. 1A shows that each of the conductive features 130 is a single layer, embodiments of the disclosure are not limited thereto. The conductive features 130 may be a multi-layer structure including conductive sub-layers. For example, the conductive sub-layers include a diffusion barrier layer, a seed layer, a metal-filling layer, one or more other suitable layers, or a combination thereof. The conductive sub-layers are not shown in figures for the purpose of simplicity and clarity.

As shown in FIG. 1A, an etching stop layer 140 is deposited over the dielectric layer 120, in accordance with some embodiments. The etching stop layer 140 covers the conductive features 130. The etching stop layer 140 is used to protect the conductive features 130 from being damaged during subsequent etching processes. The etching stop layer 140 may serve as a barrier layer, which can protect a dielectric layer (such as dielectric layer 150) from diffusion of a metal material from subsequent conductive features during subsequent thermal processes or cycles.

In some embodiments, the thickness of the etching stop layer 140 is in a range from about 10 Å to about 100 Å. In some embodiments, the etching stop layer 140 is made of or includes plasma-enhanced oxide (PEOX), tetraethoxysilane (TEOS), silicon carbide (SiC), silicon carbonitride (SiCN), silicon oxycarbide (SiCO), silicon nitride (SiN), silicon oxynitride (SiON), one or more other suitable materials, or a combination thereof. Examples of SiC include oxygen-doped silicon carbide (SiC:O, also known as ODC) and nitrogen-doped silicon carbide (SiC:N, also known as NDC). In some embodiments, the etching stop layer 140 is deposited using a CVD process, a spin-on process, one or more other suitable materials, or a combination thereof. Embodiments of the disclosure have many variations. In some other embodiments, the etching stop layer 140 is not formed.

As shown in FIG. 1A, a dielectric layer 150 is deposited over the etching stop layer 140, in accordance with some embodiments. The dielectric layer 150 serves as an IMD layer of an interconnection structure. In some embodiments, the thickness of the dielectric layer 150 is in a range from about 100 Å to about 300 Å. The materials and/or formation methods of the dielectric layer 150 are the same as or similar to those of the dielectric layer 110, as illustrated in the aforementioned embodiments, and therefore are not repeated.

As shown in FIG. 1A, a first barrier liner 160 is deposited over the dielectric layer 150, in accordance with some embodiments. The first barrier liner 160 is used to improve the reliability of subsequent conductive features (which will be described in more detail later). The first barrier liner 160 serves as a diffusion barrier layer, which can protect a dielectric layer (such as the dielectric layer 150) from diffusion of a metal material from subsequent conductive features during subsequent thermal processes or cycles. High resistance, current leakage or short circuiting, which may be induced by metal diffusion or electron migration, is reduced or eliminated. Therefore, the semiconductor device structure has improved device performance (e.g., improved electro-migration (EM) characteristics) and reliability.

In some embodiments, the thickness of the first barrier liner 160 is in a range from about 1 Å to about 20 Å. The range is only an example and is not a limitation to the disclosure. In some embodiments, the first barrier liner 160 is thinner than the etching stop layer 140, but embodiments of the disclosure are not limited thereto. In some embodiments, the first barrier liner 160 is made of or includes a diffusion barrier material. For example, the first barrier liner 160 is made of or includes nitride (such as silicon nitride), oxide (such as PEOX or TEOS), ODC, NDC, one or more other suitable materials, or a combination thereof. In some embodiments, the first barrier liner 160 is free of tantalum nitride (TaN) or a combination of TaN and Ta. The first barrier liner 160 may be referred to as a hard or dandified liner.

In some embodiments, the first barrier liner 160 is deposited using an ALD process, one or more other applicable processes, or a combination thereof. The first barrier liner 160 may be referred to as an ALD liner. In some embodiments, the first barrier liner 160 is deposited conformally and therefore the first barrier liner 160 may be referred to as a conformal liner. The first barrier liner 160 has good uniformity. In some embodiments, the deposition of the first barrier liner 160 does not include a physical vapor deposition (PVD) process and/or a CVD process.

Figure 1B:
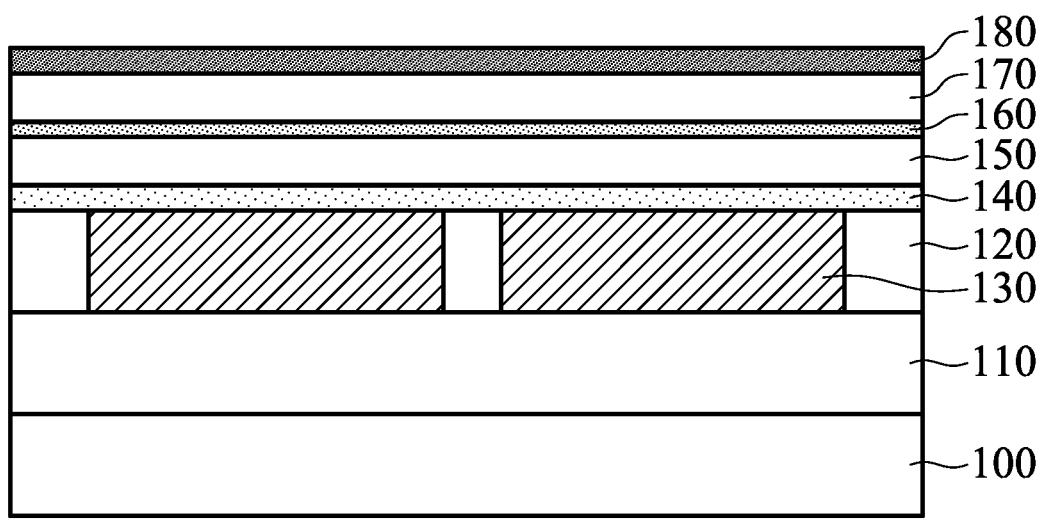

As shown in FIG. 1B, a dielectric layer 170 is deposited over the first barrier liner 160, in accordance with some embodiments. The dielectric layer 170 serves as an IMD layer of an interconnection structure. The materials and/or formation methods of the dielectric layer 170 are the same as or similar to those of the dielectric layer 110 or the dielectric layer 150, as illustrated in the aforementioned embodiments, and therefore are not repeated.

In some embodiments, the thickness of the dielectric layer 170 is in a range from about 200 Å to about 400 Å. In some embodiments, the dielectric layer 170 is thicker than the dielectric layer 150, but embodiments of the disclosure are not limited thereto. The first barrier liner 160 is thinner than the dielectric layer 170 and the dielectric layer 150. In some embodiments, the first barrier liner 160 is longitudinally sandwiched between the dielectric layer 170 and the dielectric layer 150.

As shown in FIG. 1B, a hard mask 180 is deposited over the dielectric layer 170, in accordance with some embodiments. In some embodiments, the hard mask 180 is made of or includes silicon oxide, silicon nitride, silicon oxynitride, silicon carbide, one or more other suitable materials, or a combination thereof. In some other embodiments, the hard mask 180 is a multi-layer structure, such as oxide-nitride-oxide (ONO) layers. In some embodiments, the hard mask 180 is deposited using a PVD process, a CVD process, an ALD process, one or more other applicable processes, or a combination thereof.

Figure 1C:
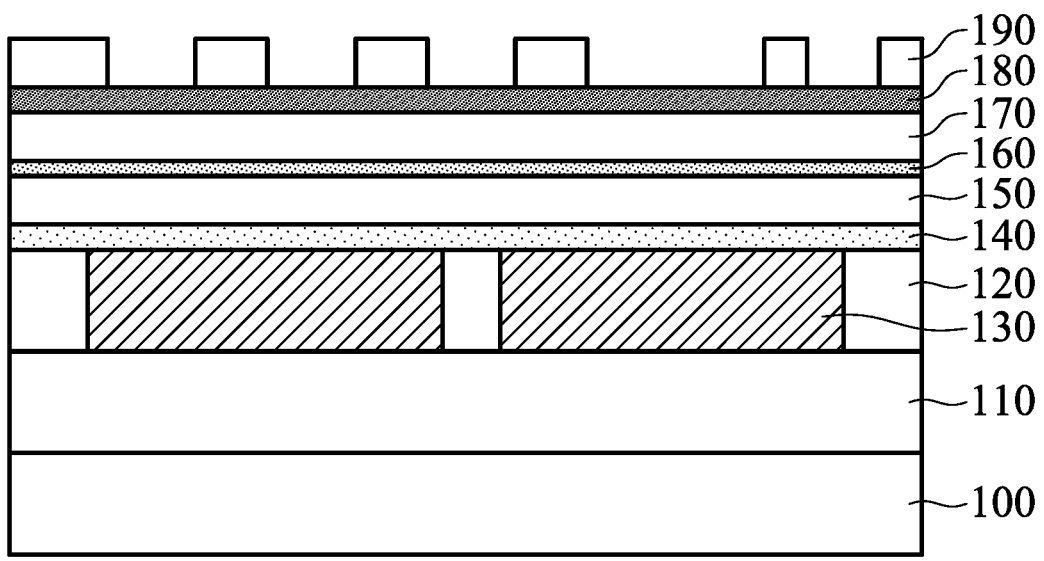

As shown in FIG. 1C, a patterned mask layer 190 is formed over the hard mask 180, in accordance with some embodiments. The mask layer 190 defines the pattern of trenches, which will subsequently be formed in the dielectric layer 170. The mask layer 190 may be a photoresist (PR) or photo-sensitive layer and is patterned using a photolithography process. The mask layer 190 may be negative type or positive type.

In some embodiments, the mask layer 190 is made of or includes polyimide, metal-containing organic-inorganic hybrid compound, one or more other suitable materials, or a combination thereof. Examples of the metal-containing organic-inorganic hybrid compound may include metal-containing oxide (such as $ZrO_x$ or $TiO_x$) or another organic-inorganic hybrid compound.

As the density of semiconductor devices increases and the size of circuit elements becomes smaller, the resolution in a photolithography process increasingly becomes important and extreme ultraviolet (EUV) radiation is widely used. Using metal-containing organic-inorganic hybrid compound as the mask layer 190 is helpful for enhancing the resolution in a photolithography process and is suitable for EUV radiation.

Although FIG. 1C shows that the mask layer 190 is a single layer, embodiments of the disclosure are not limited thereto. In some other embodiments, the mask layer 190 is a multi-layer structure including sub-layers (not shown). For example, the mask layer 190 may include a bottom layer, a middle layer, and a top PR layer.

Figure 1D:
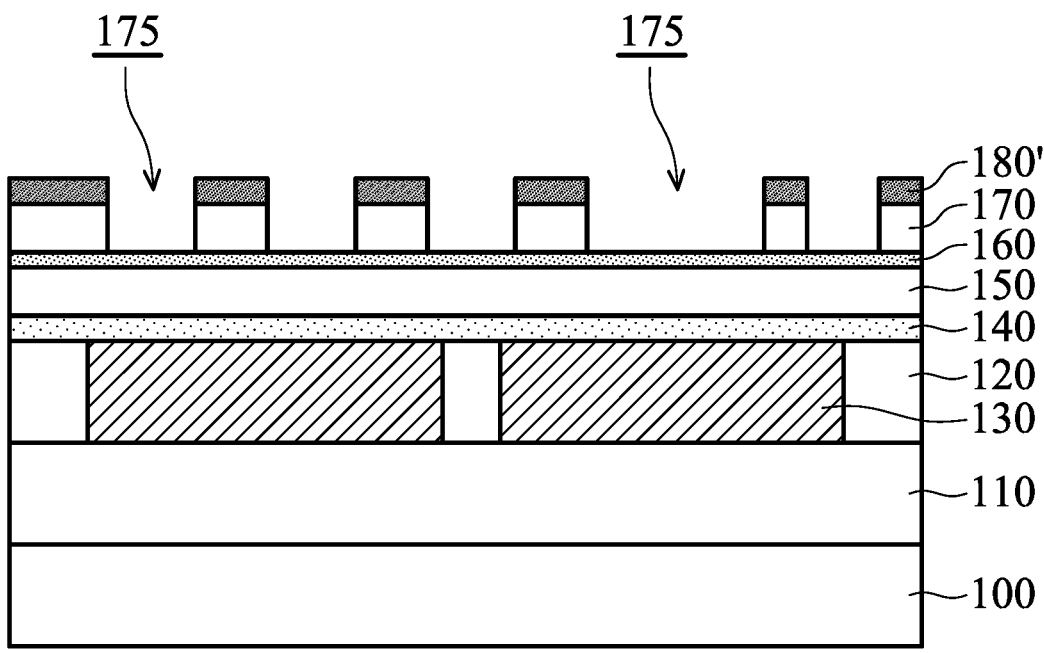

Afterwards, one or more etching processes (such as a dry etching process and/or a wet etching process) are performed over the mask layer 190. The hard mask 180 is partially etched such that a patterned hard mask 180' is formed, as shown in FIG. 1D. As a result, the pattern of trenches is transferred to the hard mask 180'.

Subsequently, one or more etching processes are performed over the hard mask 180'. The dielectric layer 170 is etched and patterned such that multiple trenches 175 are formed, as shown in FIG. 1D. The dielectric layer 170 is etched using a dry etching process, a wet etching process, or a combination thereof. In some embodiments, the first barrier liner 160 serves as an etching stop layer during the etching process for forming the trenches 175. The mask layer 190 may be removed or stripped before, during or after the etching process for forming the trenches 175.

The trenches 175 penetrate through the dielectric layer 170 such that the first barrier liner 160 is partially exposed through the trenches 175. In some embodiments, the depth of the trenches 175 in the dielectric layer 170 is in a range from about 200 Å to about 400 Å. The trenches 175 may have different dimensions from each other or substantially the same dimension.

In some embodiments, the trenches 175 have substantially vertical sidewalls, as shown in FIG. 1D. However, embodiments of the disclosure are not limited thereto. In some other embodiments, the trenches 175 have inclined sidewalls. The horizontal profile of the trenches 175 may be line-shaped or another shape.

Figure 1E:
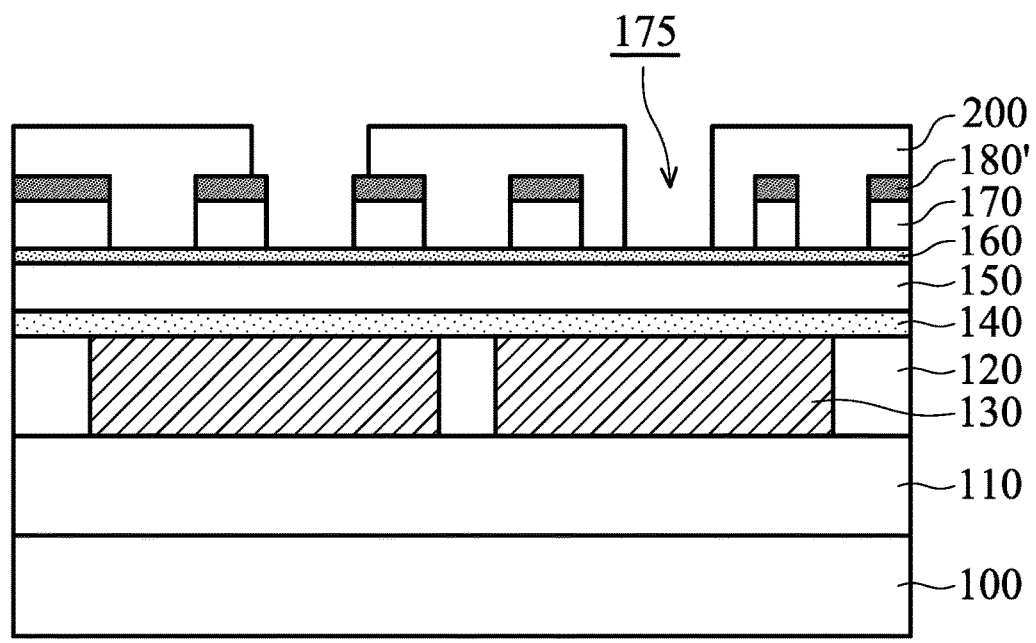

As shown in FIG. 1E, a patterned mask layer 200 is formed over the hard mask 180' and fills some of the trenches 175, in accordance with some embodiments. The mask layer 200 defines the pattern of via holes, which will subsequently be formed in the first barrier liner 160 and the dielectric layer 150. The materials and/or formation methods of the mask layer 200 are the same as or similar to those of the mask layer 190, as illustrated in the aforementioned embodiments, and therefore are not repeated.

Figure 1F:
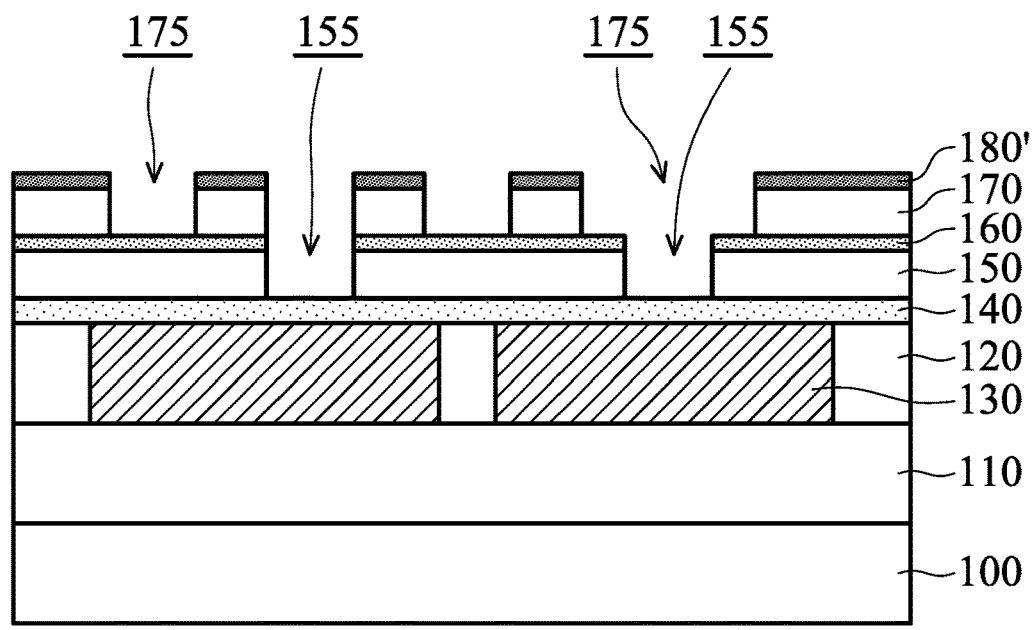

Afterwards, one or more etching processes are performed over the mask layer 200. The first barrier liner 160 and the dielectric layer 150 are etched and patterned such that multiple via holes 155 are formed, as shown in FIG. 1F. The first barrier liner 160 and the dielectric layer 150 are etched using a dry etching process, a wet etching process, or a combination thereof. As mentioned above, the etching stop layer 140 protects the conductive features 130 from being damaged during the etching process for forming the via holes 155. The first barrier liner 160 and the etching stop layer 140 are made of or include different materials. The mask layer 200 is then removed or stripped.

The via holes 155 extend from the trenches 175 penetrate through the first barrier liner 160 and the dielectric layer 150 such that the etching stop layer 140 is partially exposed through the via holes 155. In some embodiments, the depth of the via holes 155 in the dielectric layer 150 is in a range from about 100 Å to about 300 Å. The via holes 155 may have different dimensions from each other or substantially the same dimension.

The via holes 155 and the trenches 175 may have substantially the same depth or different depths. For example, the via holes 155 may have a greater depth than the trenches 175. The via holes 155 and the trenches 175 may have substantially the same width or different widths. For example, the via holes 155 may be narrower than the trenches 175. The via holes 155 and the trenches 175 may have small dimensions or any suitable dimensions. The dimensions are not a limitation to the disclosure.

In some embodiments, the via holes 155 have substantially vertical sidewalls, as shown in FIG. 1F. However, embodiments of the disclosure are not limited thereto. In some other embodiments, the via holes 155 have inclined sidewalls. The horizontal profile of the via holes 155 may be relatively rounded, circular, rectangular, square, or another shape.

Figure 1G:
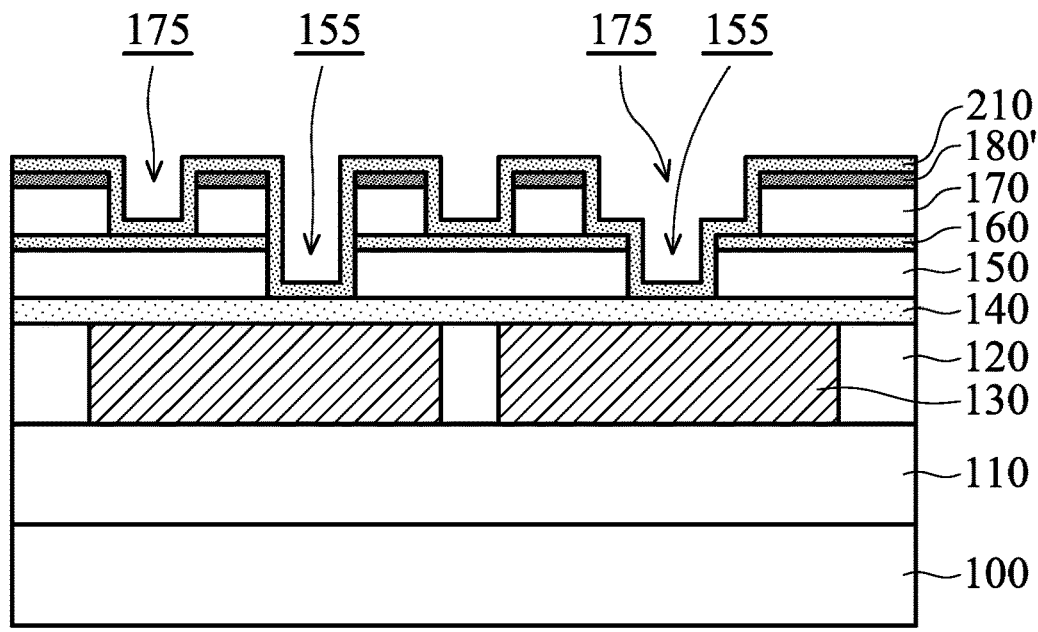

As shown in FIG. 1G, a second barrier liner 210 is deposited over the hard mask 180', in accordance with some embodiments. The second barrier liner 210 is used to improve the reliability of subsequent conductive features (which will be described in more detail later). The second barrier liner 210 serves as a diffusion barrier layer, which can protect a dielectric layer (such as the dielectric layer 170) from diffusion of a metal material from subsequent conductive features during subsequent thermal processes or cycles.

The second barrier liner 210 partially fills the via holes 155 and the trenches 175. In some embodiments, the second barrier liner 210 covers and adjoins the hard mask 180', the dielectric layer 170, the first barrier liner 160, the dielectric layer 150 and the etching stop layer 140. In some embodiments, the second barrier liner 210 and the first barrier liner 160 are separated from the top surface of the conductive features 130.

In some embodiments, a portion of the hard mask 180' is longitudinally sandwiched between the second barrier liner 210 and the dielectric layer 170. In some embodiments, a portion of the first barrier liner 160 is longitudinally sandwiched between the second barrier liner 210 and the dielectric layer 150. In some embodiments, a portion of the etching stop layer 140 is longitudinally sandwiched between the second barrier liner 210 and the conductive features 130. In some embodiments, one or more portions of the dielectric layer 170 and the hard mask 180' are surrounded by the second barrier liner 210 and the first barrier liner 160.

In some embodiments, the thickness of the second barrier liner 210 is in a range from about 1 Å to about 20 Å. The range is only an example and is not a limitation to the disclosure. The second barrier liner 210 and the first barrier liner 160 may have substantially the same thickness or different thicknesses. In some embodiments, the second barrier liner 210 is thinner than the etching stop layer 140, but embodiments of the disclosure are not limited thereto.

In some embodiments, the second barrier liner 210 is made of or includes a diffusion barrier material. For example, the second barrier liner 210 is made of or includes nitride (such as silicon nitride), oxide (such as PEOX or TEOS), ODC, NDC, one or more other suitable materials, or a combination thereof. In some embodiments, the second barrier liner 210 is free of TaN or a combination of TaN and Ta. The second barrier liner 210 may be referred to as a hard or dandified liner. The second barrier liner 210 and the first barrier liner 160 may be made of or include the same material or different materials.

In some embodiments, the second barrier liner 210 is deposited using an ALD process, one or more other applicable processes, or a combination thereof. The second barrier liner 210 may be referred to as an ALD liner. In some embodiments, the second barrier liner 210 is deposited conformally and therefore the second barrier liner 210 may be referred to as a conformal liner. The second barrier liner 210 has good uniformity.

In some embodiments, the deposition of the second barrier liner 210 includes an ALD process, rather than a PVD process and/or a CVD process. Since the second barrier liner 210 is a thin ALD liner, the dielectric layer 150 and the dielectric layer 170 are prevented from becoming damaged, such as suffering cracks or deformation. The damage in the dielectric layer 150 and the dielectric layer 170 may be induced by being pushed and pressed during a deposition process that is not an ALD process.

Figure 1H:
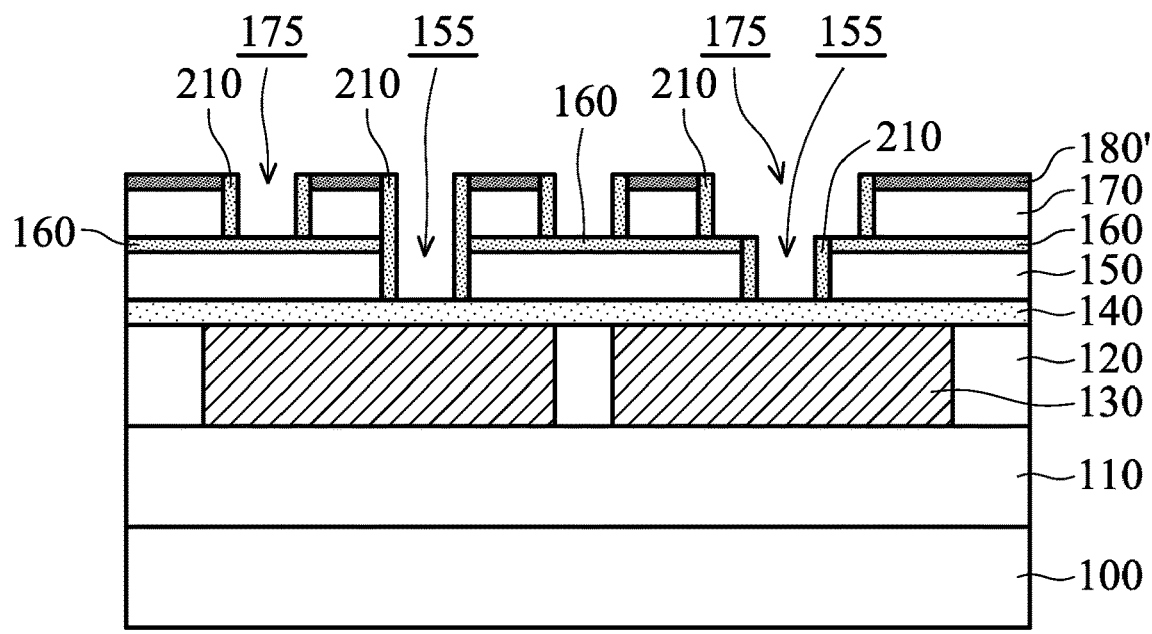

Afterwards, one or more etching processes are performed over the second barrier liner 210. The second barrier liner 210 is partially etched until the hard mask 180', the first barrier liner 160 and the etching stop layer 140 become partially exposed, as shown in FIG. 1H. The second barrier liner 210 is etched using an anisotropic etching process, such as a dry etching process, one or more other applicable processes, or a combination thereof.

More specifically, the second barrier liner 210 has horizontal portions, which cover the hard mask 180', the first barrier liner 160 and the etching stop layer 140, and longitudinal portions, which cover the sidewalls of the via holes 155 and the trenches 175. The horizontal portions of the second barrier liner 210 are removed while the longitudinal portions of the second barrier liner 210 are left on the sidewalls of the via holes 155 and the trenches 175, as shown in FIGS. 1G and 1H. The bottom surface of the via holes 155 is not covered by the first barrier liner 160, and the second barrier liner 210 exposes the bottom surface of the via holes 155, as shown in FIG. 1H.

As mentioned above, the etching stop layer 140 protects the conductive features 130 from being damaged during the etching process for the partial removal of the second barrier liner 210. In some embodiments, the hard mask 180' serves as an etching stop layer and protects the dielectric layer 170 from being damaged during the etching process for the partial removal of the second barrier liner 210.

In some embodiments, the second barrier liner 210 and the first barrier liner 160 are made of different materials, and the first barrier liner 160 can serve as an etching stop layer during the etching process for the partial removal of the second barrier liner 210. However, embodiments of the disclosure are not limited thereto. In some other embodiments, the second barrier liner 210 and the first barrier liner 160 are made of the same material.

The first barrier liner 160 is deposited before the formation of the via holes 155 and remains over the dielectric layer 150 after the partial removal of the second barrier liner 210. As a result, the first barrier liner 160 can protect the dielectric layer 150 from damage during etching processes and metal diffusion during subsequent thermal processes.

Figure 1I:
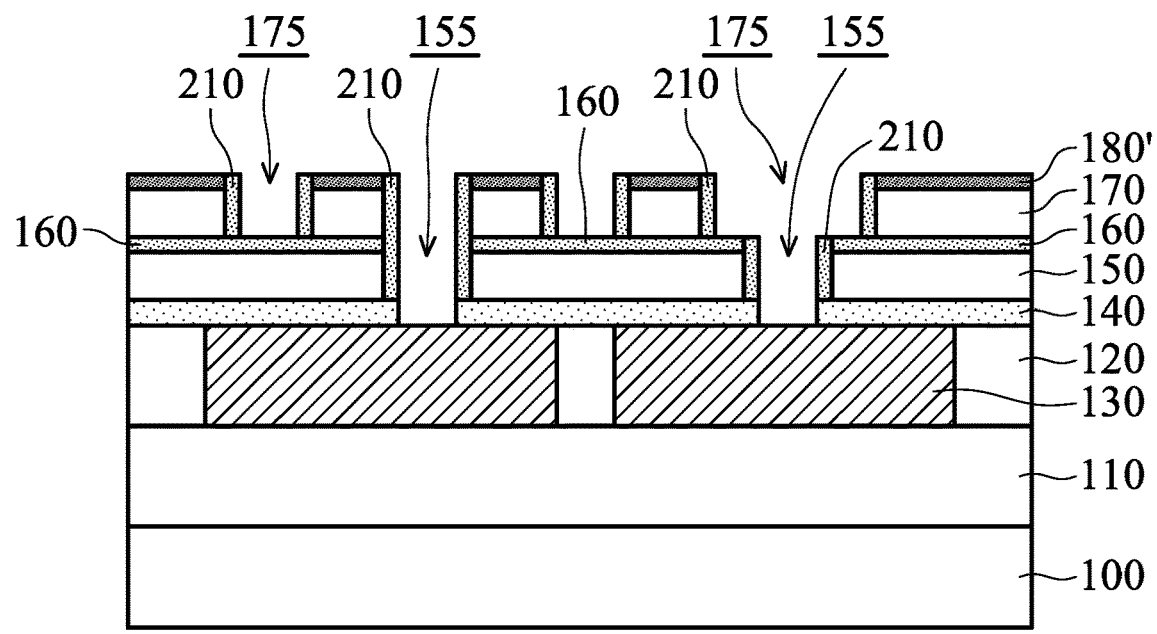

Subsequently, the etching stop layer 140 is partially removed such that the conductive features 130 become partially exposed through the via holes 155 and the trenches 175, as shown in FIG. 1I. The partial removal of the etching stop layer 140 may include one or more etching processes, such as dry etching processes, wet etching processes, or a combination thereof.

As shown in FIG. 1I, the sidewalls of the trenches 175 are covered by the second barrier liner 210 and the bottom surface of the trenches 175 is covered by the first barrier liner 160. The sidewalls of the via holes 155 are covered by the second barrier liner 210 and the etching stop layer 140 but the bottom surface of the via holes 155 is not covered by the first barrier liner 160 and the second barrier liner 210.

The first barrier liner 160 and the second barrier liner 210 protect the dielectric layer 150 and the dielectric layer 170 from being damaged during the etching process for the partial removal of the etching stop layer 140. Some portions of the dielectric layer 150 and the dielectric layer 170, which are near the via holes 155 and the trenches 175, are prevented from being modified or slightly damaged.

For example, the dielectric layer 150 and the dielectric layer 170 may include carbon and the etchant may include oxygen. Due to the first barrier liner 160 and the second barrier liner 210, carbon in the dielectric layer 150 and the dielectric layer 170 is prevented from being oxidized during the etching process. As a result, the carbon concentration of the dielectric layer 150 and the dielectric layer 170 is substantially unchanged. The dielectric constant of the dielectric layer 150 and the dielectric layer 170 maintains substantially the same. It can be ensured that the capacitance stays sufficiently low. Accordingly, the RC delay time is reduced. The operation speed of the semiconductor device structure is increased.

A microscope or spectrometer may be used to observe and analyze the modifying status or to measure the change of carbon concentration. The microscope may include a transmission electron microscope (TEM) or another suitable microscope. The spectrometer may include an electron energy loss spectrometer (EELS) or another suitable spectrometer.

Figure 1J:
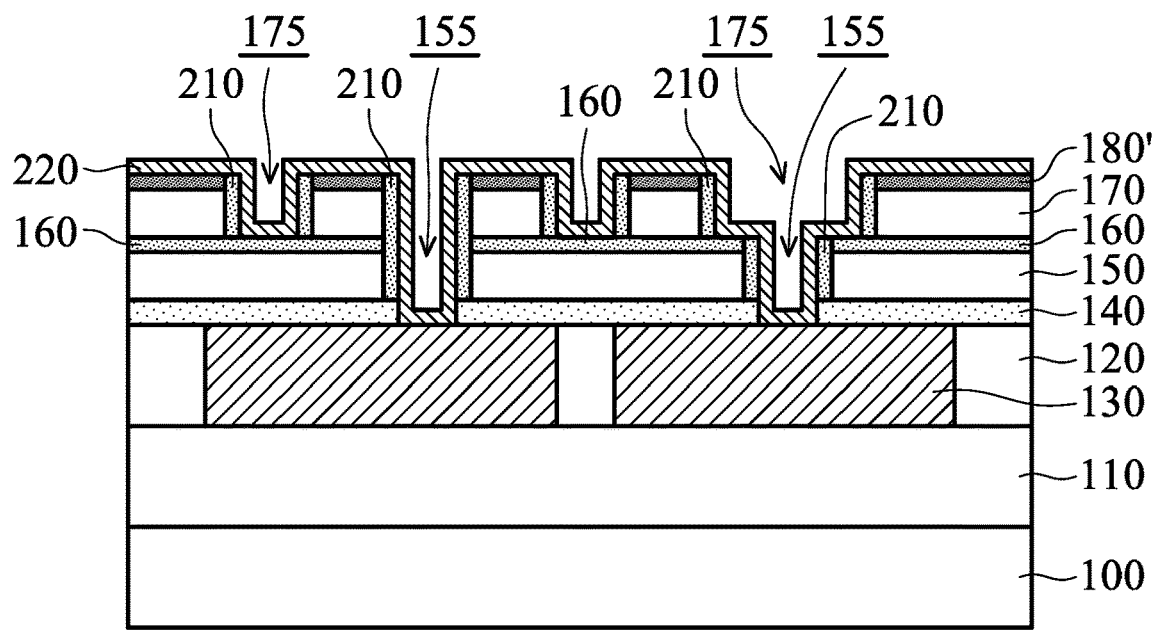

As shown in FIG. 1J, a diffusion barrier layer 220 is deposited over the hard mask 180' and fills the via holes 155 and the trenches 175, in accordance with some embodiments. In some embodiments, the diffusion barrier layer 220 is in direct contact with the hard mask 180', the second barrier liner 210, the first barrier liner 160, the etching stop layer 140, and the conductive features 130.

In some embodiments, the diffusion barrier layer 220 and the dielectric layer 170 horizontally sandwich a portion of the second barrier liner 210, as shown in FIG. 1J. In some embodiments, the diffusion barrier layer 220 and the dielectric layer 150 horizontally sandwich another portion of the second barrier liner 210. In some embodiments, the diffusion barrier layer 220 and the first barrier liner 160 horizontally sandwich yet another portion of the second barrier liner 210.

In some embodiments, the thickness of the diffusion barrier layer 220 is in a range from about 1 Å to about 10 Å. The range is only an example and is not a limitation to the disclosure. The diffusion barrier layer 220 and the first barrier liner 160 may have substantially the same thickness or different thicknesses. The diffusion barrier layer 220 and the second barrier liner 210 may have substantially the same thickness or different thicknesses.

In some embodiments, the diffusion barrier layer 220 is made of or includes ruthenium (Ru), cobalt (Co), Ta, one or more other suitable materials, or a combination thereof. In some embodiments, the diffusion barrier layer 220 is free of nitride, such as TaN or a combination of TaN and Ta. In some embodiments, the diffusion barrier layer 220 is deposited using an ALD process, a PVD process, a CVD process, one or more other applicable processes, or a combination thereof. In some embodiments, the diffusion barrier layer 220 is deposited conformally.

Many variations and/or modifications can be made to embodiments of the disclosure. In some other embodiments, the deposition of the diffusion barrier layer 220 includes an ALD process, rather than a PVD process and/or a CVD process. The diffusion barrier layer 220 has good uniformity. Since the diffusion barrier layer 220 may be a thin ALD layer, the dielectric layer 150 and the dielectric layer 170 are prevented from being damaged, such as suffering cracks or deformation. As a result, bending and dislocation of conductive features, which are subsequently formed in the dielectric layer 150 and the dielectric layer 170, can be avoided.

Many variations and/or modifications can be made to embodiments of the disclosure. In some other embodiments, the diffusion barrier layer 220 is not formed.

Figure 1K:
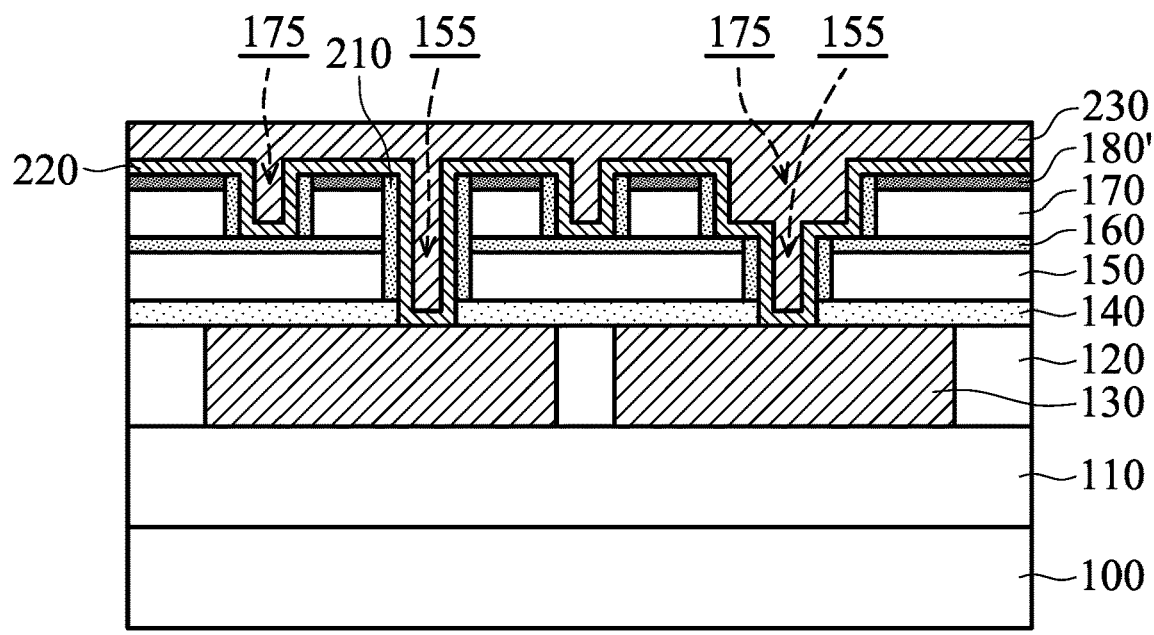

As shown in FIG. 1K, a conductive layer 230 is deposited over the diffusion barrier layer 220 and fills the via holes 155 and the trenches 175, in accordance with some embodiments. The conductive layer 230 and the diffusion barrier layer 220 together fill up the via holes 155 and the trenches 175. The conductive layer 230 is thicker than each of the diffusion barrier layer 220, the first barrier liner 160 and the second barrier liner 210.

In some embodiments, the conductive layer 230 and the hard mask 180' longitudinally sandwich a portion of the diffusion barrier layer 220, as shown in FIG. 1K. In some embodiments, the conductive layer 230 and the first barrier liner 160 longitudinally sandwich another portion of the diffusion barrier layer 220. In some embodiments, the conductive layer 230 and the second barrier liner 210 horizontally sandwich yet another portion of the diffusion barrier layer 220. In some embodiments, the conductive layer 230 and one of the conductive features 130 longitudinally sandwich yet another portion of the diffusion barrier layer 220.

In some embodiments, the conductive layer 230 is made of or includes Cu, Al, W, Ti, Ni, Au, Pt, one or more other suitable materials, or a combination thereof. In some other embodiments, the conductive layer 230 is made of or includes Ru, Co, one or more other suitable materials, or a combination thereof. In some embodiments, the conductive layer 230 is deposited using an electroplating process, a PVD process, a CVD process, an electroless plating process, one or more other applicable processes, or a combination thereof. The conductive layer 230 may include a seed layer, which is not shown in figures for the purpose of simplicity and clarity.

In some embodiments, the conductive layer 230 and the diffusion barrier layer 220 are made of different materials, but embodiments of the disclosure are not limited thereto. For example, the conductive layer 230 may be made of Cu and the diffusion barrier layer 220 may be made of Ru, Co or Ta which can prevent metal diffusion or electron migration without increasing electrical resistance. The diffusion barrier layer 220 protects the dielectric layer 150 and the dielectric layer 170 from diffusion of a metal material from the conductive layer 230 during subsequent thermal processes or cycles. In some embodiments, the combination of the diffusion barrier layer 220, the first barrier liner 160 and the second barrier liner 210 significantly reduces or eliminates metal diffusion or electron migration of the conductive layer 230. The dielectric layer 150 and the dielectric layer 170 are prevented from being damaged.

In some embodiments, a thermal process is performed so that metal atoms in the diffusion barrier layer 220 are drafted into the conductive layer 230. The metal atoms from the diffusion barrier layer 220 fix or strengthen the bonds between metal atoms (such as Cu or Al) in the conductive layer 230. Therefore, the conductive layer 230 can be prevented from being pulled and thereby breaking or peeling when the semiconductor device operates and current flows through the conductive layer 230. The diffusion barrier layer 220 improves the reliability of the conductive layer 230.

As mentioned above, in some other embodiments, the diffusion barrier layer 220 is not formed so that the conductive layer 230 is in direct contact with the hard mask 180', the second barrier liner 210, the first barrier liner 160, the etching stop layer 140, and the conductive features 130. In these embodiments, the conductive layer 230 is made of or includes a material that is substantially free of metal migration during thermal processes, such as Ru, Co, one or more other suitable materials, or a combination thereof.

In some other embodiments, the conductive layer 230 is made of or includes a material that may induce metal migration during thermal processes when the diffusion barrier layer 220 is not formed. Even if the conductive layer 230 is made of or includes a material that may induce metal migration, the first barrier liner 160 and the second barrier liner 210 can provide with the dielectric layer 150 and the dielectric layer 170 sufficient protection from the metal migration. As a result, the capacitance still stays sufficiently low.

Figure 1L:
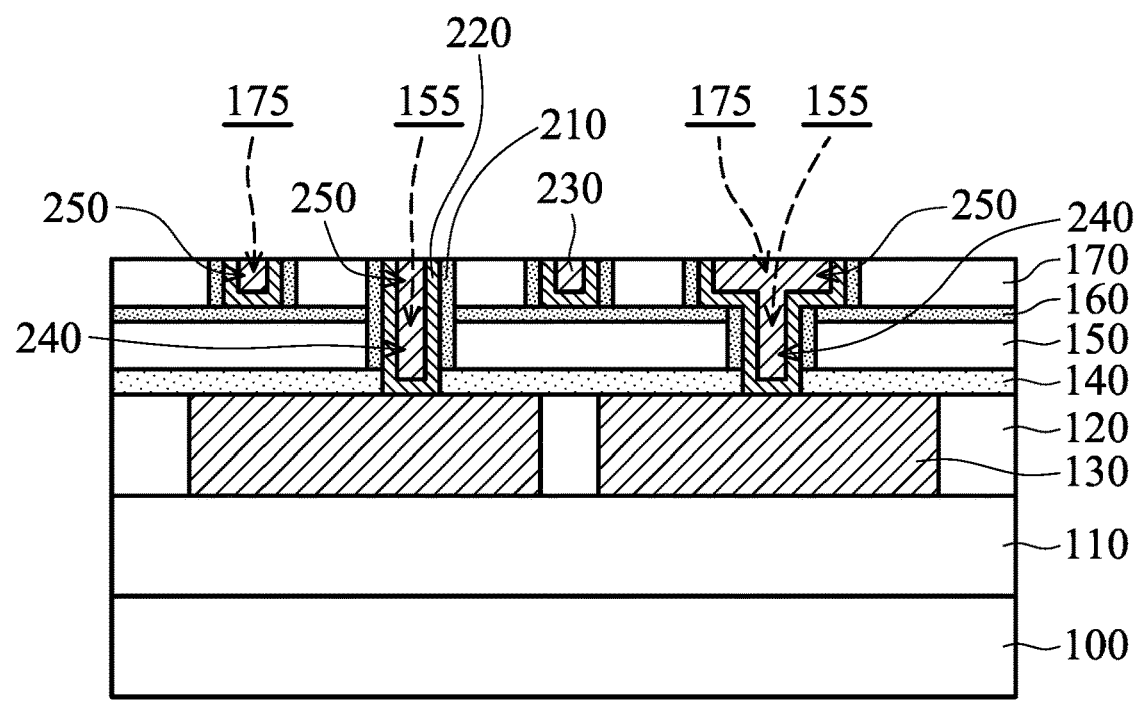

Afterwards, a planarization process is performed to remove portions of the diffusion barrier layer 220 and the conductive layer 230 outside of the trenches 175. The remaining portions of the diffusion barrier layer 220 and the conductive layer 230 in the via holes 155 and the trenches 175 form conductive features 240 and 250, as shown in FIG. 1L. The hard mask 180' is removed during the planarization process. As a result, the dielectric layer 170 and the second barrier liner 210 become exposed during and after the planarization process. The second barrier liner 210 is also polished and partially removed during the planarization process. The planarization process may include a CMP process, a dry polishing process, a grinding process, an etching process, one or more other applicable processes, or a combination thereof.

In some embodiments, the steps described in FIGS. 1A-1L may be referred to as dual damascene processes. Although FIGS. 1A-1F show a trench-first process, embodiments of the disclosure are not limited thereto. Embodiments of the disclosure may be applied to a via-first process.

As shown in FIG. 1L, the conductive features 240 and 250 are confined in the first barrier liner 160 and the second barrier liner 210. The conductive features 250 are electrically connected to the conductive features 130 through the conductive features 240. The conductive features 250 may be referred to as conductive lines. The conductive features 240 may be referred to as conductive vias. The conductive features 240 and 250 may have substantially the same width or different widths. For example, the conductive features 250 may be wider than the conductive features 240. As a result, there may be a corner between the conductive features 240 and the conductive features 250. The corner is filled with the second barrier liner 210. The second barrier liner 210 filling the corner separates the first barrier liner 160 from the conductive features 240.

In some embodiments, the first barrier liner 160 horizontally extends between two of the conductive features 240, as shown in FIG. 1L. In some embodiments, the first barrier liner 160 and the second barrier liner 210 are spaced apart from the bottom surface of the conductive features 240. In some embodiments, the horizontal interface between the first barrier liner 160 and the second barrier liner 210 is substantially coplanar with the bottom surface of the conductive features 250.

As shown in FIG. 1L, the first barrier liner 160 and the second barrier liner 210 enclose the side edges of the conductive features 240 and 250, in accordance with some embodiments. The combination of the first barrier liner 160 and the second barrier liner 210 may be referred to as a barrier liner feature. The combination of the conductive features 240 and 250 may be referred to as an interconnection feature. In other words, the side edges and corners of the interconnection feature are enclosed by the barrier liner feature. Therefore, the barrier liner feature provides the dielectric layer 150 and the dielectric layer 170 with sufficient protection from metal diffusion of the interconnection feature.

More specifically, the first barrier liner 160 and the second barrier liner 210 encircle the sidewalls and the bottom surface of the conductive features 250. The second barrier liner 210 and the etching stop layer 140 encircle the sidewalls of the conductive features 240.

There is no barrier liner adjoining the bottom surface of the conductive features 240. In some embodiments, there is no TaN material adjoining the conductive features 130. As a result, the electrical resistance between the conductive features 240 and the conductive features 130 is greatly reduced. It can be ensured that the RC delay time is sufficiently low. Accordingly, the operation speed of the semiconductor device structure is increased. The semiconductor device structure has enhanced electrical performance.

The first barrier liner 160 and the second barrier liner 210 have good adhesion to the conductive features 240 and 250. The first barrier liner 160 and the second barrier liner 210 confirm and support the conductive features 240 and 250 in the dielectric layer 150 and the dielectric layer 170. As a result, the conductive features 240 and 250 have improved physical strength. Since the first barrier liner 160 and the second barrier liner 210 include a hard material, the first barrier liner 160 and the second barrier liner 210 can resist stress, which may be induced during the formation of the conductive features 240 and 250. The conductive features 240 and 250 are prevented from bending, cracking or peeling due to stress. Therefore, the semiconductor device structure includes a stable and reliable interconnection structure.

Afterwards, one or more dielectric layers and multiple conductive features are formed over the dielectric layer 170 and the conductive features 240 and 250 to continue the formation of the interconnection structure of the semiconductor device structure. In some embodiments, the operations illustrated in FIGS. 1A-1L are repeated one or more times to continue the formation of the interconnection structure.

For example, an upper etching stop layer, which may be the same as or similar to the etching stop layer 140, may be deposited to cover the dielectric layer 170 and the conductive features 240 and 250. Afterwards, the same or similar steps as those described in FIGS. 1A-1L are performed over the upper etching stop layer.

Figure 2:
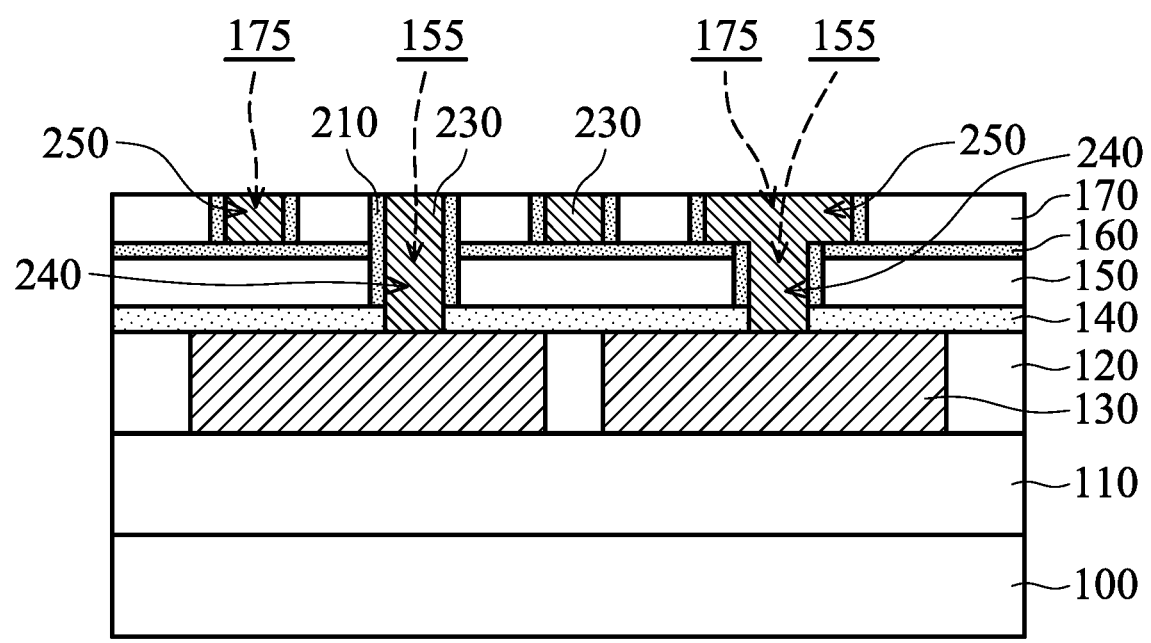
FIG. 2 is a cross-sectional view of a semiconductor device structure, in accordance with some embodiments.

Many variations and/or modifications can be made to embodiments of the disclosure. For example, the conductive features 240 and 250 may not include the diffusion barrier layer 220. FIG. 2 is a cross-sectional view of a semiconductor device structure, in accordance with some embodiments. The semiconductor device structure shown in FIG. 2 is similar to that shown in FIG. 1L. In some embodiments, the materials, formation methods, and/or benefits of the semiconductor device structure shown in FIGS. 1A-1L can also be applied in the embodiments illustrated in FIG. 2, and are therefore not repeated.

As shown in FIG. 2, the conductive features 240 and 250 are made of the conductive layer 230, in accordance with some embodiments. For example, similar to the stages shown in FIGS. 1J and 1K, the conductive layer 230 is deposited over the hard mask 180' and fills the via holes 155 and the trenches 175. A planarization process is then performed to remove portions of the conductive layer 230 outside of the trenches 175. The remaining portions of the conductive layer 230 in the via holes 155 and the trenches 175 form conductive features 240 and 250, as shown in FIG. 2.

In some embodiments, the conductive layer 230 shown in FIG. 2 is made of or includes a bulk material that is substantially free of metal migration during thermal processes, such as Ru, Co, one or more other suitable materials, or a combination thereof. However, embodiments of the disclosure are not limited. The conductive layer 230 shown in FIG. 2 may be made of or include Cu, Al, W, Ti, Ni, Au, Pt, one or more other suitable materials, or a combination thereof.

In some embodiments, the conductive layer 230 is in direct contact with the second barrier liner 210, the first barrier liner 160, the etching stop layer 140, and the conductive features 130. In some embodiments, a portion of the first barrier liner 160 is longitudinally sandwiched between the conductive layer 230 and the dielectric layer 150, as shown in FIG. 2. In some embodiments, a portion of the second barrier liner 210 is horizontally sandwiched between the conductive layer 230 and the dielectric layer 150 or the dielectric layer 170. In some embodiments, another portion of the second barrier liner 210 is horizontally sandwiched between the conductive layer 230 and the first barrier liner 160.

Many variations and/or modifications can be made to embodiments of the disclosure. For example, FIGS. 1A-1L show that the first barrier liner 160 is deposited before the formation of the trenches 175, but embodiments of the disclosure are not limited. The first barrier liner 160 may be deposited after the formation of the trenches 175. FIGS. 3A-3K are cross-sectional views of various stages of a process for forming a semiconductor device structure, in accordance with some embodiments. The stages shown in FIGS. 3A-3K are similar to those shown in FIGS. 1A-1L. In some embodiments, the materials, formation methods, and/or benefits of the semiconductor device structure shown in FIGS. 1A-1L can also be applied in the embodiments illustrated in FIGS. 3A-3K, and are therefore not repeated.

Figure 3A:
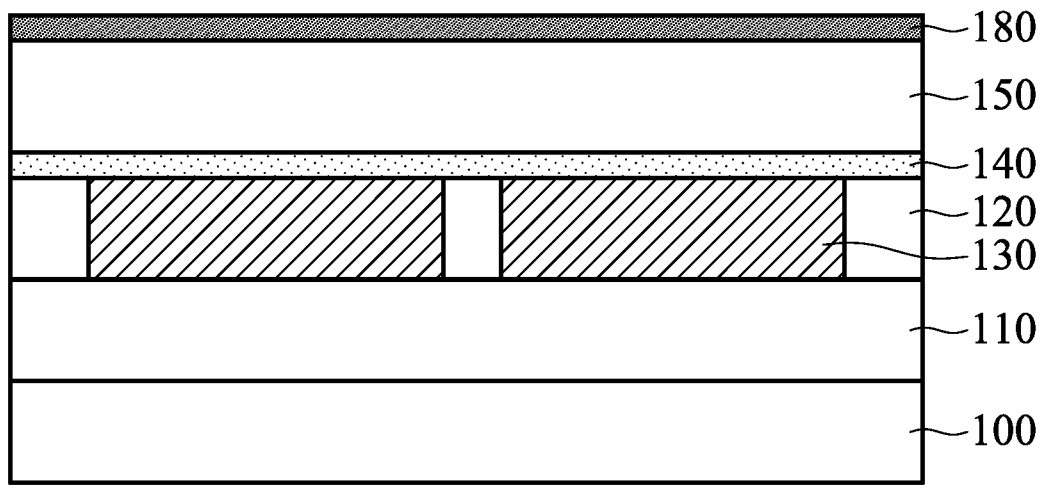
FIGS. 3A-3K are cross-sectional views of various stages of a process for forming a semiconductor device structure, in accordance with some embodiments.

As shown in FIG. 3A, an etching stop layer 140 is deposited over the dielectric layer 120 and covers the conductive features 130, in accordance with some embodiments. Subsequently, a dielectric layer 150 is deposited over the etching stop layer 140 and a hard mask 180 is deposited over the dielectric layer 150, in accordance with some embodiments. In some embodiments, the thickness of the dielectric layer 150 is in a range from about 400 Å to about 800 Å. The dielectric layer 150 shown in FIG. 3A is thicker than the dielectric layer 150 shown in FIG. 1A.

Figure 3B:
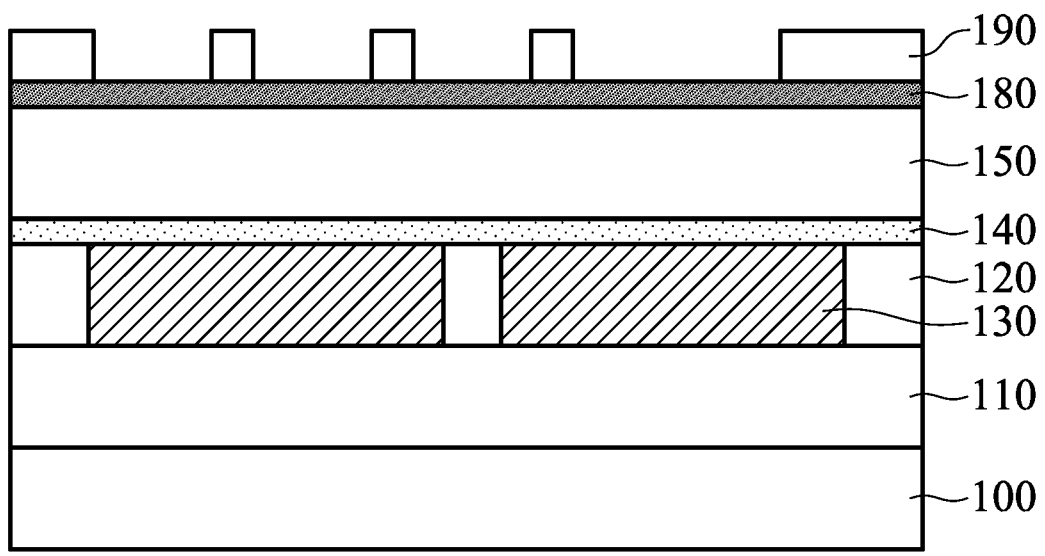

As shown in FIG. 3B, a patterned mask layer 190 is then formed over the hard mask 180, in accordance with some embodiments. The mask layer 190 defines the pattern of trenches, which will subsequently be formed in the dielectric layer 150.

Figure 3C:
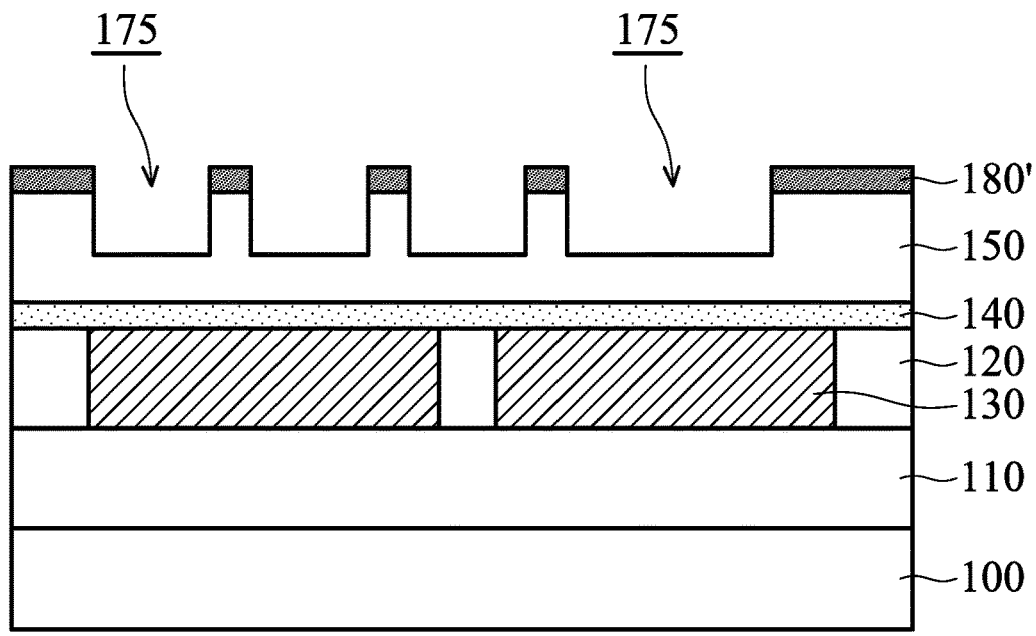

Afterwards, one or more etching processes (such as a dry etching process and/or a wet etching process) are performed over the mask layer 190. The hard mask 180 is partially etched such that a patterned hard mask 180' is formed, as shown in FIG. 3C. As a result, the pattern of trenches is transferred to the hard mask 180'.

Subsequently, one or more etching processes are performed over the hard mask 180'. The dielectric layer 150 is etched and patterned such that multiple trenches 175 are formed, as shown in FIG. 3C. The dielectric layer 150 is etched using a dry etching process, a wet etching process, or a combination thereof. The mask layer 190 may be removed or stripped before, during or after the etching process for forming the trenches 175.

The trenches 175 extend in the dielectric layer 150 without penetrating through the dielectric layer 150. In some embodiments, the depth of the trenches 175 in the dielectric layer 150 is in a range from about 200 Å to about 400 Å.

Figure 3D:
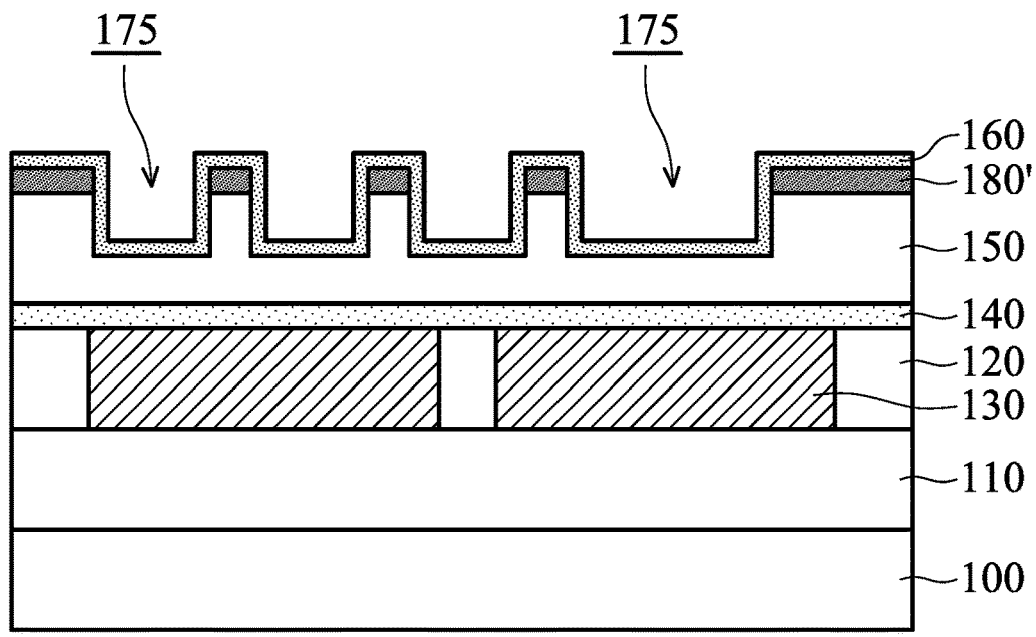

As shown in FIG. 3D, a first barrier liner 160 is deposited over the hard mask 180' and fills the trenches 175, in accordance with some embodiments. In some embodiments, the first barrier liner 160 is deposited conformally in the trenches 175. In some embodiments, the first barrier liner 160 is in direct contact with the hard mask 180' and the dielectric layer 150.

Figure 3E:
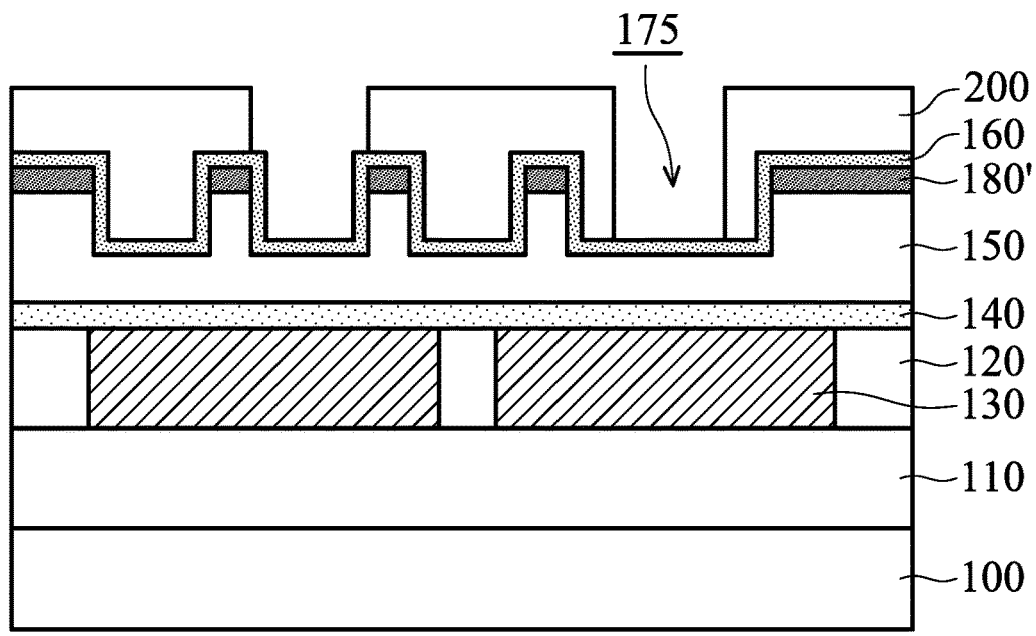

As shown in FIG. 3E, a patterned mask layer 200 is formed over the first barrier liner 160 and fills some of the trenches 175, in accordance with some embodiments. The mask layer 200 defines the pattern of via holes, which will subsequently be formed in the first barrier liner 160 and the dielectric layer 150.

Figure 3F:
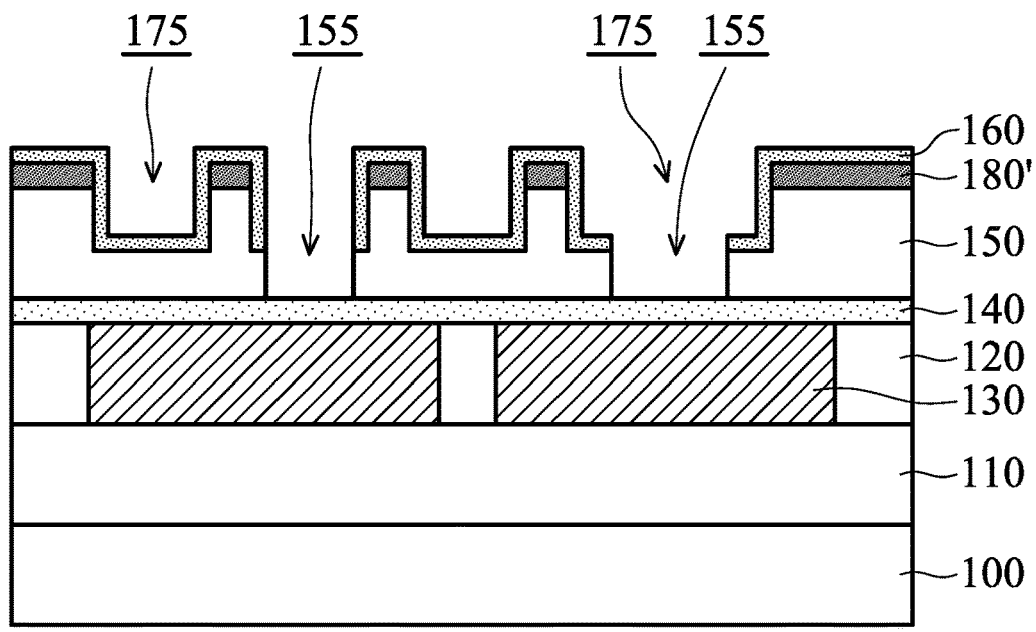

Afterwards, one or more etching processes are performed over the mask layer 200. The first barrier liner 160 and the dielectric layer 150 are etched and patterned such that multiple via holes 155 are formed, as shown in FIG. 3F. The first barrier liner 160 and the dielectric layer 150 are etched using a dry etching process, a wet etching process, or a combination thereof. The mask layer 200 is then removed or stripped.

The etching stop layer 140 protects the conductive features 130 from being damaged during the etching process for forming the via holes 155. The first barrier liner 160 also protects the dielectric layer 150 from being damaged during the etching process. Some portions of the dielectric layer 150, which are near the trenches 175, are prevented from being modified or slightly damaged. For example, due to the first barrier liner 160, carbon in the dielectric layer 150 is prevented from being oxidized during the etching process. As a result, the dielectric constant of the dielectric layer 150 maintains substantially the same. The capacitance stays sufficiently low and the RC delay time is reduced.

The via holes 155 extend from the trenches 175 and penetrate through the first barrier liner 160 and the dielectric layer 150 such that the etching stop layer 140 is partially exposed through the via holes 155. In some embodiments, the depth of the via holes 155 in the dielectric layer 150 is in a range from about 200 Å to about 400 Å. The via holes 155 and the trenches 175 may have substantially the same depth or different depths. For example, the via holes 155 may have a greater depth than the trenches 175. The via holes 155 and the trenches 175 may have substantially the same width or different widths. For example, the via holes 155 may be narrower than the trenches 175.

Figure 3G:
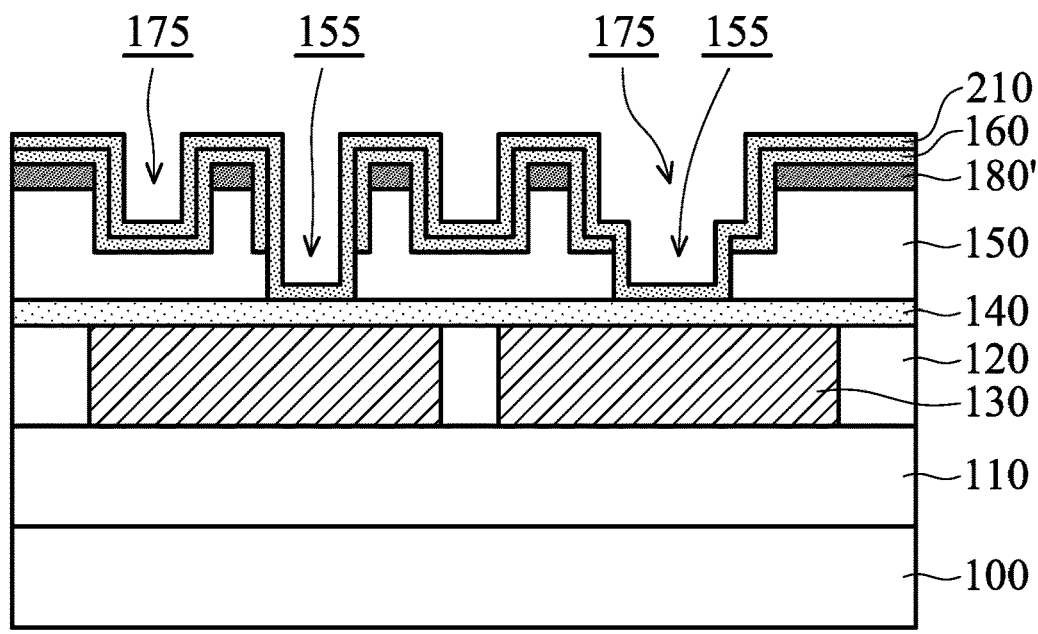

As shown in FIG. 3G, a second barrier liner 210 is deposited over the first barrier liner 160 and partially fills the via holes 155 and the trenches 175, in accordance with some embodiments. In some embodiments, the second barrier liner 210 is in direct contact with the first barrier liner 160, the dielectric layer 150 and the etching stop layer 140.

In some embodiments, a portion of the first barrier liner 160 is longitudinally or horizontally sandwiched between the second barrier liner 210 and the hard mask 180'. As a result, the second barrier liner 210 is separated from the hard mask 180' by the first barrier liner 160. In some embodiments, a portion of the first barrier liner 160 is longitudinally or horizontally sandwiched between the second barrier liner 210 and the dielectric layer 150. In some embodiments, a portion of the etching stop layer 140 is longitudinally sandwiched between the second barrier liner 210 and the conductive features 130.

Figure 3H:
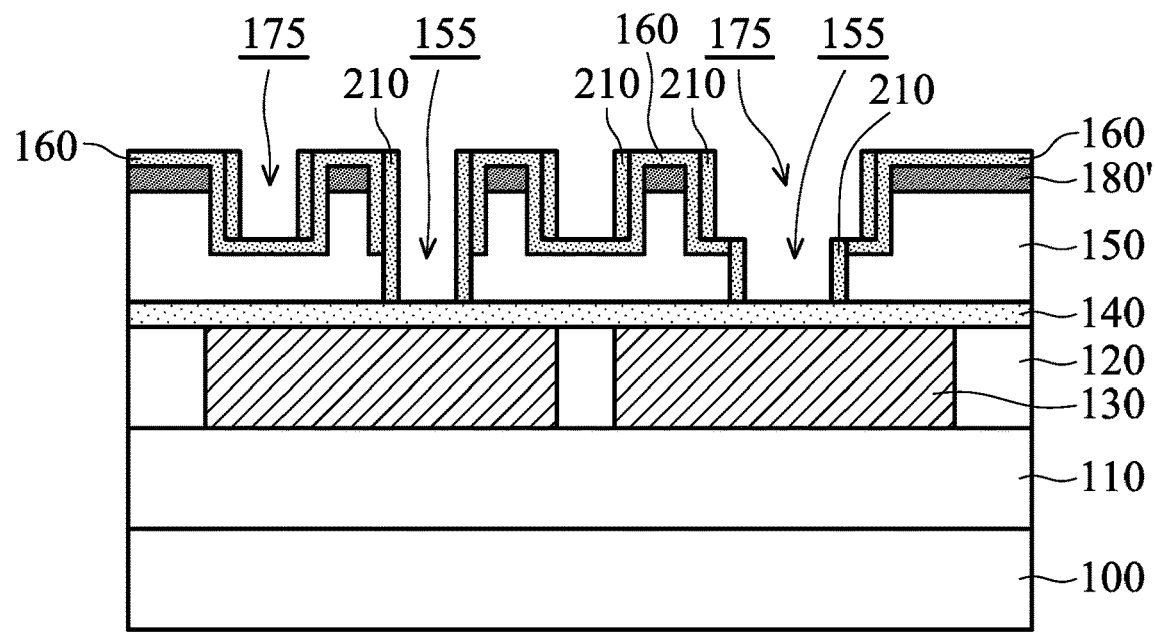

Afterwards, one or more etching processes are performed over the second barrier liner 210. The second barrier liner 210 is partially etched until the first barrier liner 160 and the etching stop layer 140 become exposed, as shown in FIG. 3H.

More specifically, the second barrier liner 210 has horizontal portions, which cover the first barrier liner 160 and the etching stop layer 140, and longitudinal portions, which extend along the sidewalls of the via holes 155 and the trenches 175. The horizontal portions of the second barrier liner 210 are removed while the longitudinal portions of the second barrier liner 210 are left in the via holes 155 and the trenches 175, as shown in FIGS. 3G and 3H. The bottom surface of the via holes 155 is not covered by the first barrier liner 160, and the second barrier liner 210 exposes the bottom surface of the via holes 155, as shown in FIG. 3H. The hard mask 180' remains covered by the first barrier liner 160 during and after the etching process for the partial removal of the second barrier liner 210.

The etching stop layer 140 protects the conductive features 130 from being damaged during the etching process for the partial removal of the second barrier liner 210. In some embodiments, the second barrier liner 210 and the first barrier liner 160 are made of different materials. The first barrier liner 160 can serve as an etching stop layer and protect the dielectric layer 150 from being damaged during the etching process for the partial removal of the second barrier liner 210.

The first barrier liner 160 is deposited after the formation of the trenches 175 and before the formation of the via holes 155 and remains over the dielectric layer 150 after the partial removal of the second barrier liner 210. As a result, the first barrier liner 160 can protect the dielectric layer 150 from damage during etching processes and metal diffusion during subsequent thermal processes.

Figure 3I:
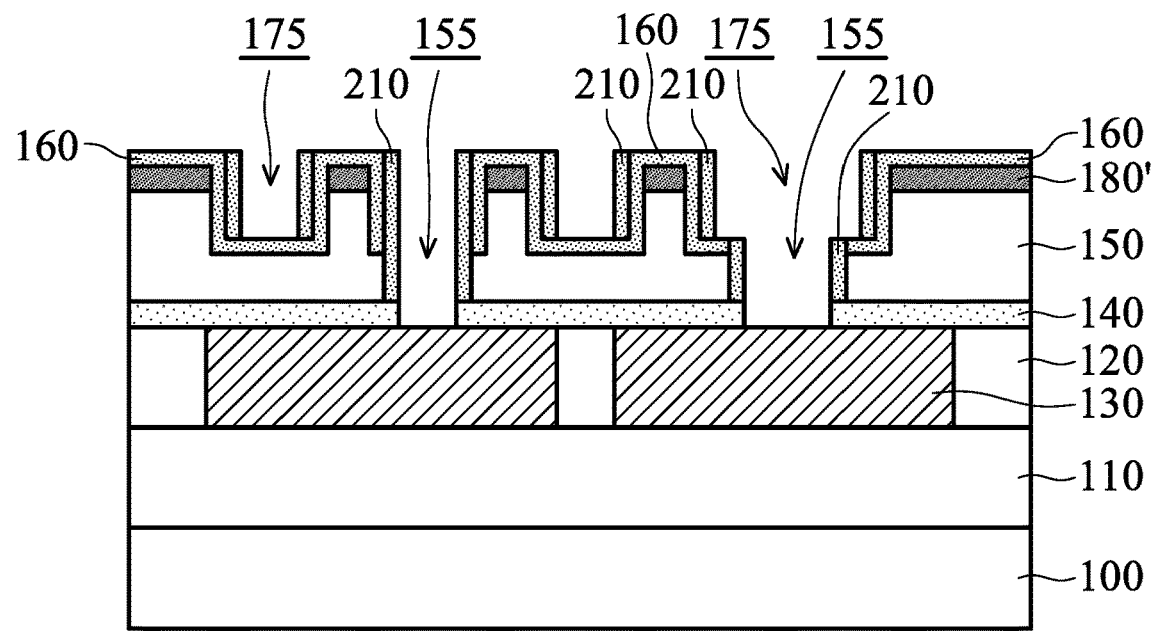

Subsequently, the etching stop layer 140 is partially removed such that the conductive features 130 become partially exposed through the via holes 155 and the trenches 175, as shown in FIG. 3I. The first barrier liner 160 and the second barrier liner 210 protect the dielectric layer 150 from being damaged during the etching process. As a result, the dielectric constant of the dielectric layer 150 maintains substantially the same. The capacitance stays sufficiently low and the RC delay time is reduced.

Figure 3J:
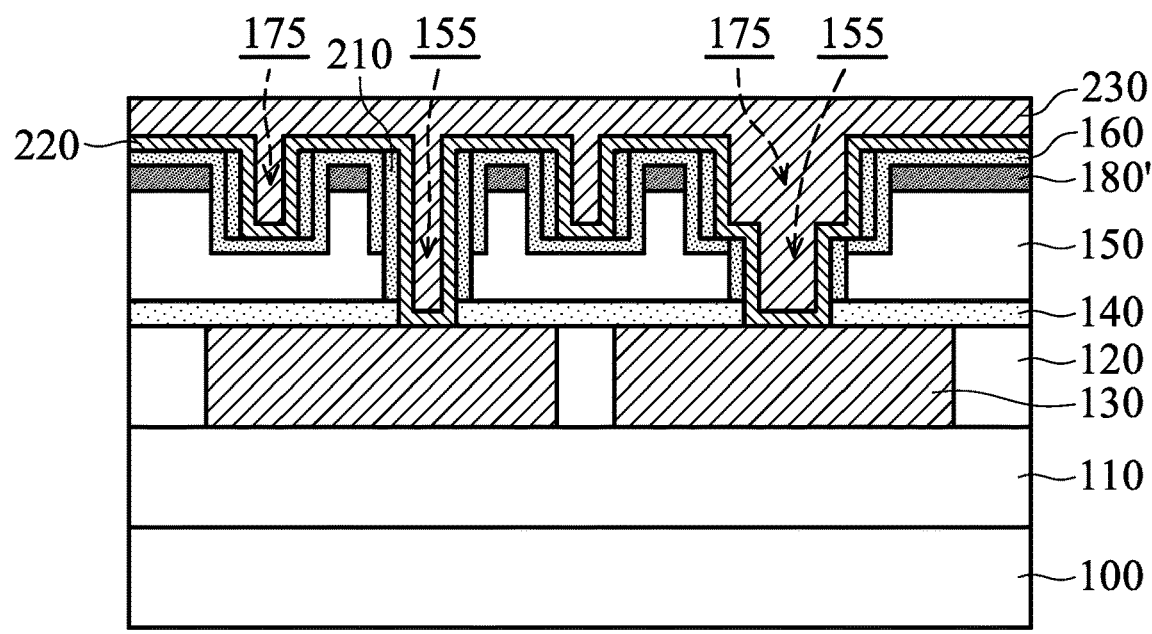

As shown in FIG. 3J, a diffusion barrier layer 220 are deposited over the second barrier liner 210 and fills the via holes 155 and the trenches 175, in accordance with some embodiments. In some embodiments, the diffusion barrier layer 220 is in direct contact with the second barrier liner 210, the first barrier liner 160, the etching stop layer 140, and the conductive features 130.

In some embodiments, a portion of the first barrier liner 160 is longitudinally sandwiched between the diffusion barrier layer 220 and the hard mask 180', as shown in FIG. 3J. In some embodiments, a portion of the first barrier liner 160 is longitudinally sandwiched between the diffusion barrier layer 220 and the dielectric layer 150.

In some embodiments, a portion of the second barrier liner 210 is horizontally sandwiched between the diffusion barrier layer 220 and the dielectric layer 150, as shown in FIG. 3J. In some embodiments, another portion of the second barrier liner 210 is horizontally sandwiched between the diffusion barrier layer 220 and the first barrier liner 160.

As shown in FIG. 3J, a conductive layer 230 is deposited over the diffusion barrier layer 220 and fills the via holes 155 and the trenches 175, in accordance with some embodiments. The conductive layer 230 and the diffusion barrier layer 220 together fill the via holes 155 and the trenches 175.

In some embodiments, a portion of the diffusion barrier layer 220 is longitudinally sandwiched between the conductive layer 230 and the first barrier liner 160, as shown in FIG. 3J. In some embodiments, another portion of the diffusion barrier layer 220 is horizontally sandwiched between the conductive layer 230 and the second barrier liner 210. In some embodiments, yet another portion of the diffusion barrier layer 220 is longitudinally sandwiched between the conductive layer 230 and one of the conductive features 130.

Figure 3K:
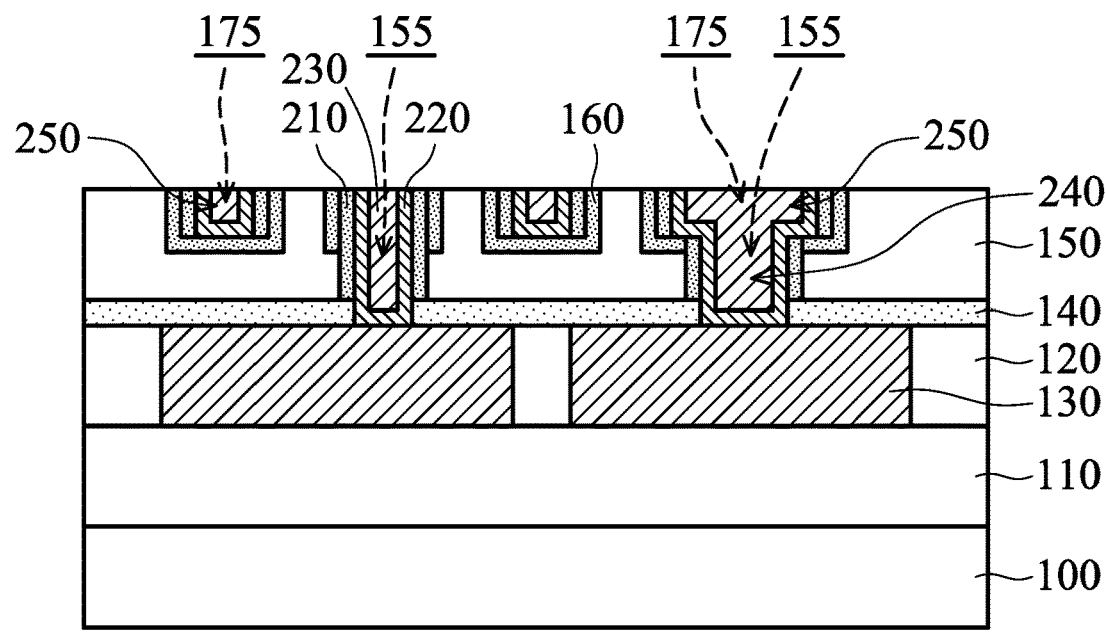

A planarization process is then performed to remove portions of the diffusion barrier layer 220 and the conductive layer 230 outside of the trenches 175. The remaining portions of the diffusion barrier layer 220 and the conductive layer 230 in the via holes 155 and the trenches 175 form conductive features 240 and 250, as shown in FIG. 3K. The hard mask 180' is removed during the planarization process. As a result, the dielectric layer 150, the first barrier liner 160 and the second barrier liner 210 become exposed during and after the planarization process. The first barrier liner 160 and the second barrier liner 210 are also polished and partially removed during the planarization process.

In some embodiments, the steps described in FIGS. 3A-3K may be referred to as dual damascene processes. Although FIGS. 3A-3F show a trench-first process, embodiments of the disclosure are not limited thereto. Embodiments of the disclosure may be applied to a via-first process.

As shown in FIG. 3K, the first barrier liner 160 and the second barrier liner 210 enclose the side edges and corners of the conductive features 240 and 250, in accordance with some embodiments. In some embodiments, the first barrier liner 160 horizontally extends between two of the conductive features 240. In some embodiments, the first barrier liner 160 extends from the bottom surface of the conductive features 250 along the sidewall (or side edges) of the conductive features 250, as shown in FIG. 3K.

More specifically, the first barrier liner 160 and the second barrier liner 210 encircle the sidewalls of the conductive features 250. The first barrier liner 160 covers or overlies the bottom surface of the conductive features 250. The second barrier liner 210 and the etching stop layer 140 encircle the sidewalls of the conductive features 240.

There is no barrier liner adjoining the bottom surface of the conductive features 240. In some embodiments, there is no TaN material adjoining the conductive features 130. As a result, the electrical resistance between the conductive features 240 and the conductive features 130 is greatly reduced.

Afterwards, one or more dielectric layers and multiple conductive features are formed over the dielectric layer 150 and the conductive features 240 and 250 to continue the formation of the interconnection structure of the semiconductor device structure. In some embodiments, the operations illustrated in FIGS. 3A-3K are repeated one or more times to continue the formation of the interconnection structure.

For example, an upper etching stop layer, which may be the same as or similar to the etching stop layer 140, may be deposited to cover the dielectric layer 150 and the conductive features 240 and 250. An upper dielectric layer, which may be the same as or similar to the dielectric layer 150, may be deposited over the upper etching stop layer. Afterwards, the same or similar steps as those described in FIGS. 3A-3K are performed over the upper dielectric layer to continue the formation of the interconnection structure.

Figure 4:
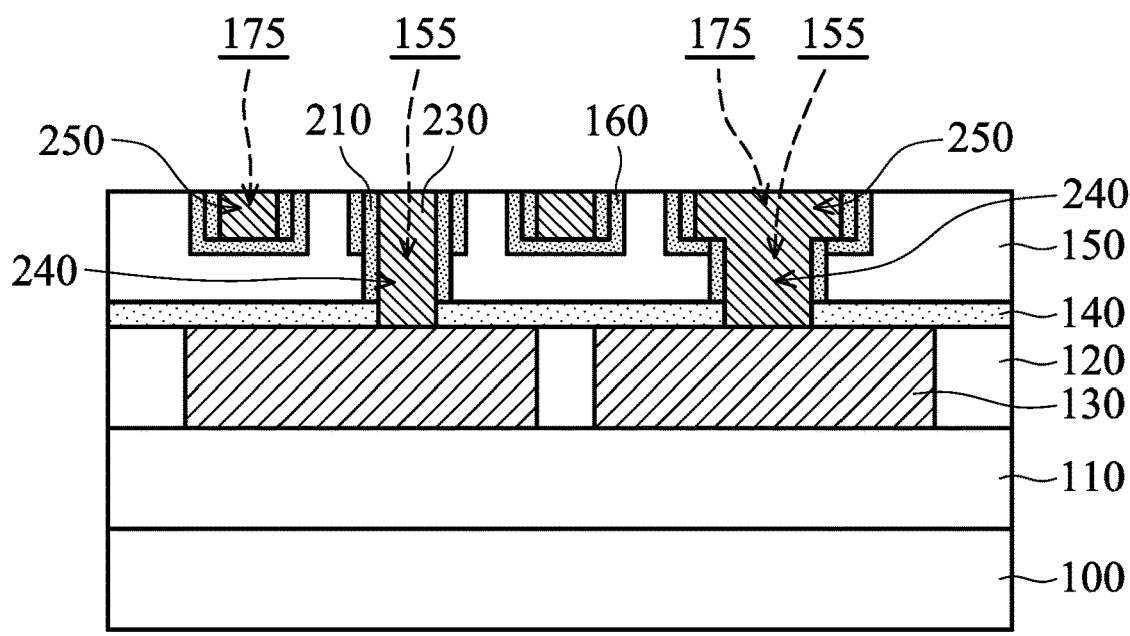
FIG. 4 is a cross-sectional view of a semiconductor device structure, in accordance with some embodiments.

Many variations and/or modifications can be made to embodiments of the disclosure. As mentioned above, the conductive features 240 and 250 may not include the diffusion barrier layer 220. FIG. 4 is a cross-sectional view of a semiconductor device structure, in accordance with some embodiments. The semiconductor device structure shown in FIG. 4 is similar to those shown in FIGS. 1L, 2 and 3K. In some embodiments, the materials, formation methods, and/or benefits of the semiconductor device structure shown in FIGS. 1A-1L, 2 and 3A-3K can also be applied in the embodiments illustrated in FIG. 4, and are therefore not repeated.

As shown in FIG. 4, the conductive features 240 and 250 are made of the conductive layer 230, in accordance with some embodiments. For example, similar to the stages shown in FIG. 3J, the conductive layer 230 is deposited over the first barrier liner 160 and the second barrier liner 210 and fills the via holes 155 and the trenches 175. A planarization process is then performed to remove portions of the conductive layer 230 outside of the trenches 175. The remaining portions of the conductive layer 230 in the via holes 155 and the trenches 175 form conductive features 240 and 250, as shown in FIG. 4.

In some embodiments, the conductive layer 230 shown in FIG. 4 is made of or includes a bulk material that is substantially free of metal migration during thermal processes, such as Ru, Co, one or more other suitable materials, or a combination thereof. However, embodiments of the disclosure are not limited. The conductive layer 230 shown in FIG. 4 may be made of or include Cu, Al, W, Ti, Ni, Au, Pt, one or more other suitable materials, or a combination thereof.

In accordance with some embodiments, the semiconductor device structure shown in FIGS. 1L, 2, 3K and 4 includes a more reliable interconnection structure with enhanced performance. The interconnection structure includes the conductive features 240 and 250, the first barrier liner 160 and the second barrier liner 210. The side edges and corners of the conductive features 240 and 250 are sufficiently surrounded by the first barrier liner 160 and the second barrier liner 210. As a result, the first barrier liner 160 and the second barrier liner 210 reduce or eliminated metal diffusion or electron migration from the conductive features 240 and 250 to the dielectric layer of the interconnection structure.

The first barrier liner 160 and the second barrier liner 210 are free of TaN material and do not extend under the conductive features 240 and 250. Since there is no TaN material between the conductive features 130 and the conductive features 240, electrical resistance is greatly reduced. Accordingly, the device performance and reliability of the semiconductor device structure can both be improved due to the first barrier liner 160 and the second barrier liner 210.

Furthermore, the first barrier liner 160 and the second barrier liner 210 have better physical strength themselves. The first barrier liner 160 and the second barrier liner 210 also increase the physical strength and adhesion of the conductive features 240 and 250 in the dielectric layer of the interconnection structure. The first barrier liner 160 and the second barrier liner 210 further protect the dielectric layer of the interconnection structure from damage during etching processes. Therefore, the reliability of the semiconductor device structure is enhanced even further.

In some embodiments, the formation methods described in FIGS. 1A-1L, 2, 3A-3K and 4 are used to form an interconnection structure of a semiconductor device. However, embodiments of the disclosure are not limited. In some other embodiments, the formation methods described in the disclosure can be used to form any suitable conductive structures surrounded by barrier liners.

Embodiments of the disclosure can be applied to not only a semiconductor device structure with planar FETs but also a semiconductor device structure with FinFETs or other applicable devices. Embodiments of the disclosure are not limited and may be applied to fabrication processes for any suitable technology generation. Various technology generations include a 28 nm node, a 20 nm node, a 16 nm node, a 10 nm node, a 7 nm node, a 5 nm node, a 3 nm node, or another suitable node.

Embodiments of the disclosure provide structures and formation methods of a semiconductor device structure. The semiconductor device structure includes an interconnection feature in a dielectric layer and a barrier liner feature between the interconnection feature and the dielectric layer. The barrier liner feature surrounds the side edges and corners of the interconnection feature so as to provide the dielectric layer with sufficient protection from metal diffusion or electron migration of the interconnection feature. The barrier liner feature does not cover the bottom of the interconnection feature. As a result, electrical resistance between the interconnection feature and an underlying interconnection feature is greatly reduced. Therefore, the electrical performance and reliability of the semiconductor device structure are both enhanced even further.

In accordance with some embodiments, a semiconductor device structure is provided. The semiconductor device structure includes a first dielectric layer over a semiconductor substrate and a conductive feature in the first dielectric layer. The semiconductor device structure also includes an etching stop layer over the first dielectric layer and a second dielectric layer over the etching stop layer. The semiconductor device structure further includes a conductive via over the conductive feature. The conductive via is in the etching stop layer and the second dielectric layer. In addition, the semiconductor device structure includes a conductive line over the conductive via. The conductive line is electrically connected to the conductive feature through the conductive via. The semiconductor device structure also includes a first barrier liner covering the bottom surface of the conductive line. The semiconductor device structure further includes a second barrier liner surrounding the sidewall of the conductive line and the sidewall of the conductive via. The conductive line and the conductive via are confined in the first barrier liner and the second barrier liner.

In accordance with some embodiments, a semiconductor device structure is provided. The semiconductor device structure includes a first conductive feature in a first dielectric layer. The semiconductor device structure also includes a second dielectric layer over the first dielectric layer. The semiconductor device structure further includes a second conductive feature in the second dielectric layer. In addition, the semiconductor device structure includes a third conductive feature over the second conductive feature. The third conductive feature and the second conductive feature are electrically connected to the first conductive feature. The semiconductor device structure also includes a first barrier liner covering a bottom surface of the third conductive feature. The semiconductor device structure further includes a second barrier liner surrounding side edges of the second conductive feature and the third conductive feature. The first barrier liner and the second barrier liner are spaced apart from a bottom surface of the second conductive feature.

In accordance with some embodiments, a method for forming a semiconductor device structure is provided. The method includes depositing an etching stop layer over a first dielectric layer. The etching stop layer covers a conductive feature in the first dielectric layer. The method also includes depositing a second dielectric layer over the etching stop layer and depositing a first barrier liner over the second dielectric layer. The method further includes forming a trench over the conductive feature and etching the first barrier liner and the second dielectric layer to form a via hole exposing the etching stop layer. In addition, the method includes depositing a second barrier liner in the trench and the via hole. The method also includes partially removing the second barrier liner to expose the first barrier liner and the etching stop layer. The method further includes partially removing the etching stop layer to expose the conductive feature and filling the trench and the via hole with a conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a first dielectric layer over a semiconductor substrate;
   a conductive feature in the first dielectric layer;
   an etching stop layer over the first dielectric layer;
   a second dielectric layer over the etching stop layer;
   a conductive via over the conductive feature, wherein the conductive via is in the etching stop layer and the second dielectric layer;
   a third dielectric layer over the second dielectric layer;
   a fourth dielectric layer between the first dielectric layer and the semiconductor substrate, wherein the fourth dielectric layer is in direct contact with a bottom surface of the conductive feature;
   a conductive line in the third dielectric layer and over the conductive via, wherein the conductive line is electrically connected to the conductive feature through the conductive via;
   a second conductive line in the third dielectric layer and above the second dielectric layer;
   a first barrier liner between the second dielectric layer and the third dielectric layer, wherein the first barrier liner covers a bottom surface of the conductive line, the first barrier liner is in direct contact with an entirety of a bottom surface of the second conductive line, and in direct contact a bottom surface of the third dielectric layer and a top surface of the second dielectric layer, wherein the first barrier liner extends along the entirety of the bottom surface of the second conductive line and reaches the bottom surface of the conductive line, and wherein the entirety of the bottom surface of the second conductive line is spaced apart from the second dielectric layer by the first barrier liner;
   a second barrier liner surrounding a sidewall of the conductive line and a sidewall of the conductive via, wherein the conductive line and the conductive via are confined in the first barrier liner and the second barrier liner, and the first barrier liner is in direct contact with the bottom surface of the conductive line and separated from the sidewall of the conductive via by the second barrier liner;
   a third conductive line in the etching stop layer, the second dielectric layer, the first barrier liner, and the third dielectric layer; and
   a third barrier liner surrounding a sidewall of the third conductive line, wherein the third barrier liner penetrating through the second dielectric layer, the first barrier liner, and the third dielectric layer and has a bottom surface in direct contact a top surface of the etching stop layer.

2. The semiconductor device structure as claimed in claim 1, wherein the conductive via comprises a conductive layer and a diffusion barrier layer between the conductive layer and the second barrier liner, and wherein a portion of the second barrier liner is between the diffusion barrier layer and the first barrier liner.

3. The semiconductor device structure as claimed in claim 1, wherein the conductive via comprises a conductive layer and a diffusion barrier layer between the conductive layer and the second barrier liner, and wherein the diffusion barrier layer comprises Ru, Co, Ta, or a combination thereof.

4. The semiconductor device structure as claimed in claim 1, wherein the first barrier liner and/or the second barrier liner comprise silicon nitride, plasma-enhanced oxide, tetraethoxysilane, oxygen-doped silicon carbide, nitrogen-doped silicon carbide, or a combination thereof.

5. The semiconductor device structure as claimed in claim 1, wherein a portion of the etching stop layer is sandwiched between the conductive feature and the second barrier liner.

6. The semiconductor device structure as claimed in claim 1, wherein the third dielectric layer and the second dielectric layer sandwich the first barrier liner.

7. The semiconductor device structure as claimed in claim 1, further comprising:
a second conductive feature in the first dielectric layer and below the third conductive line, wherein a portion of the etching stop layer is sandwiched between the second conductive feature and the third barrier liner.

8. A semiconductor device structure, comprising:
a first conductive feature in a first dielectric layer;
a second dielectric layer over the first dielectric layer;
a second conductive feature in the second dielectric layer;
a third dielectric layer over the second dielectric layer;
a third conductive feature in the third dielectric layer and over the second conductive feature, wherein the third conductive feature and the second conductive feature are electrically connected to the first conductive feature;
a fourth dielectric layer in direct contact with a bottom surface of the first dielectric layer and a bottom surface of the conductive feature;
a fourth conductive feature in the third dielectric layer and above the second dielectric layer;
a first barrier liner between the second dielectric layer and the third dielectric layer, wherein the first barrier liner is in direct contact with a bottom surface of the third conductive feature, in direct contact with an entirety of a bottom surface of the fourth conductive feature, and in direct contact a bottom surface of the third dielectric layer and a top surface of the second dielectric layer, wherein the first barrier liner extends along the entirety of the bottom surface of the fourth conductive feature and reaches the bottom surface of the third conductive feature, and wherein the entirety of the bottom surface of the fourth conductive feature is spaced apart from the second dielectric layer by the first barrier liner;
a second barrier liner surrounding side edges of the second conductive feature and the third conductive feature, wherein the first barrier liner and the second barrier liner are spaced apart from a bottom surface of the second conductive feature, and wherein the first barrier liner is separated from the side edge of the second conductive feature by the second barrier liner;
an etching stop layer between the first dielectric layer and the second dielectric layer;
a fifth conductive feature in the etching stop layer, the second dielectric layer, the first barrier liner, and the third dielectric layer; and
a third barrier liner surrounding a sidewall of the fifth conductive feature, wherein the third barrier liner penetrating through the second dielectric layer, the first barrier liner, and the third dielectric layer, and wherein a bottom surface of the third barrier liner is separated from a bottom surface of the fifth conductive feature by the etch stop layer.

9. The semiconductor device structure as claimed in claim 8, wherein the etching stop layer separates the second barrier liner from the bottom surface of the second conductive feature.

10. The semiconductor device structure as claimed in claim 8, wherein an interface between the first barrier liner and the second barrier liner is substantially coplanar with the bottom surface of the third conductive feature.

11. The semiconductor device structure as claimed in claim 8, wherein the second barrier liner adjoins the second dielectric layer and separates the first barrier liner from the second conductive feature.

12. The semiconductor device structure as claimed in claim 8, wherein the third conductive feature and/or the second conductive feature comprise Cu, Ru, Co, or a combination thereof.

13. The semiconductor device structure as claimed in claim 8, wherein the first barrier liner and the second barrier liner are free of TaN.

14. A semiconductor device structure, comprising:
a first dielectric layer over a semiconductor substrate;
an etching stop layer between the first dielectric layer and the semiconductor substrate;
a second dielectric layer over the first dielectric layer;
a conductive feature having a via portion and a line portion over the via portion, wherein the via portion is in the first dielectric layer and the etching stop layer, and the line portion is in the second dielectric layer;
a second conductive feature in the second dielectric layer and above the first dielectric layer;
a third conductive feature in a third dielectric layer and in direct contact with an entirety of a bottom surface of the conductive feature;
a fourth dielectric layer in direct contact with a bottom surface of the third dielectric layer and a bottom surface of the third conductive feature;
a first barrier liner between the second dielectric layer and the first dielectric layer, wherein the first barrier liner covers a bottom surface of the line portion of the conductive feature, the first barrier liner is in direct contact with an entirety of a bottom surface of the second conductive feature, and in direct contact a bottom surface of the second dielectric layer and a top surface of the first dielectric layer, wherein the first barrier liner extends along the entirety of the bottom surface of the second conductive feature and reaches the bottom surface of the line portion of the conductive feature, and wherein the entirety of the bottom surface of the second conductive feature is spaced apart from the first dielectric layer by the first barrier liner;
a second barrier liner over the etch stop layer and surrounding sidewalls of the via portion and the line portion of the conductive feature, so that the first dielectric layer is separated from the via portion of the conductive feature by the second barrier liner and the etch stop layer, and the first barrier liner is in direct contact with the bottom surface of the line portion of the conductive feature and separated from the sidewall of the via portion of the conductive feature by the second barrier liner;
a fourth conductive feature having a second via portion and a second line portion over the second via portion, wherein the second via portion is in the first dielectric layer and the etching stop layer, and the second line portion is in the second dielectric layer; and
a third barrier liner surrounding sidewalls of the second via portion and the second line portion, wherein the third barrier liner has a bottom surface in direct contact a top surface of the etching stop layer, and the third barrier liner extends through the first dielectric layer, the second dielectric layer, and the first barrier liner.

15. The semiconductor device structure as claimed in claim 14, wherein the second barrier liner is between the line portion of the conductive feature and the second dielectric layer.

16. The semiconductor device structure as claimed in claim 14, wherein the conductive feature comprises a conductive layer and a diffusion barrier layer between the conductive layer and the second barrier liner.

17. The semiconductor device structure as claimed in claim 14, wherein the first barrier liner surrounds the second barrier liner that surrounds the sidewall of the via portion of the conductive feature.

18. The semiconductor device structure as claimed in claim 14, wherein the first barrier liner and the second barrier liner are free of TaN.

19. The semiconductor device structure as claimed in claim 14, further comprising:
   a fifth conductive feature in the third dielectric layer and below the second via portion, wherein a portion of the etching stop layer is sandwiched between the fifth conductive feature and the third barrier liner.

20. The semiconductor device structure as claimed in claim 19, wherein the third conductive feature and the fifth conductive feature are sandwiched between the fourth dielectric layer and the etching stop layer.

\* \* \* \* \*